(12) United States Patent
Song et al.

(10) Patent No.: US 9,859,529 B2
(45) Date of Patent: Jan. 2, 2018

(54) ORGANIC LIGHT EMITTING DISPLAY DEVICE

(71) Applicant: LG DISPLAY CO., LTD., Seoul (KR)

(72) Inventors: Ki-Woog Song, Goyang-si (KR); JeongHaeng Heo, Paju-si (KR); Taeil Kum, Paju-si (KR); Seung Kim, Seoul (KR); Heedong Choi, Uiwang-si (KR); HyungJune Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 49 days.

(21) Appl. No.: 14/939,579

(22) Filed: Nov. 12, 2015

(65) Prior Publication Data

US 2016/0141555 A1  May 19, 2016

(30) Foreign Application Priority Data

Nov. 13, 2014 (KR) .................. 10-2014-0158315
Sep. 30, 2015 (KR) .................. 10-2015-0138248

(51) Int. Cl.
*H01L 51/52* (2006.01)
*H01L 51/50* (2006.01)
*H01L 27/32* (2006.01)

(52) U.S. Cl.
CPC ........ *H01L 51/5278* (2013.01); *H01L 51/504* (2013.01); *H01L 27/3209* (2013.01); *H01L 51/5265* (2013.01); *H01L 2251/558* (2013.01)

(58) Field of Classification Search
CPC . H01L 51/52; H01L 51/5265; H01L 51/5044; H01L 51/5278; H01L 51/3209
See application file for complete search history.

(56) References Cited

U.S. PATENT DOCUMENTS

| | | | |
|---|---|---|---|
| 2009/0146552 A1* | 6/2009 | Spindler | H01L 51/5036 313/504 |
| 2012/0008318 A1* | 1/2012 | Ishiwata | H05B 33/086 362/231 |
| 2012/0175598 A1* | 7/2012 | Balaganesan | C07D 209/88 257/40 |
| 2014/0117338 A1* | 5/2014 | Cho | H01L 51/5044 257/40 |
| 2015/0060812 A1* | 3/2015 | Kim | H01L 27/3209 257/40 |
| 2015/0171359 A1* | 6/2015 | Forrest | H01L 51/5016 257/40 |

* cited by examiner

*Primary Examiner* — Phuc Dang
(74) *Attorney, Agent, or Firm* — Birch, Stewart, Kolasch & Birch, LLP

(57) ABSTRACT

Discussed is an organic light emitting display device for reducing a color defect or a color difference which occurs in the front or side of the organic light emitting display device. The organic light emitting display device can include a first electrode, a second electrode and an organic layer between the first electrode and the second electrode, the organic layer including at least one emission part. The organic layer is configured for a peak wavelength of an electroluminescence (EL) spectrum of the organic light emitting display device emitted from the at least one emission part to have a range from 10 nm less a predetermined peak wavelength to 10 nm more than the predetermined peak wavelength.

30 Claims, 10 Drawing Sheets

ORGANIC LIGHT EMITTING DISPLAY DEVICE

CROSS-REFERENCE TO RELATED APPLICATIONS

This application claims the priority benefit of the Korean Patent Application No. 10-2014-0158315 filed on Nov. 13, 2014 and the Korean Patent Application No. 10-2015-0138248 filed on Sep. 30, 2015. All of these applications are hereby incorporated by reference as if fully set forth herein.

BACKGROUND OF THE INVENTION

Field of the Invention

The present invention relates to an organic light emitting display device, and more particularly, to an organic light emitting display device for reducing a color defect or a color difference which occurs in the front or side of the organic light emitting display device.

Discussion of the Related Art

Recently, as society advances to the information-oriented society, the field of display devices which visually express an electrical information signal is rapidly advancing. Various types of display devices, having excellent performance in terms of thinning, lightening, and low power consumption, have been developed.

Examples of the display devices include liquid crystal display (LCD) devices, plasma display panel (PDP) devices, field emission display (FED) devices, organic light emitting display devices, etc.

In particular, the organic light emitting display devices use self-emitting devices. In comparison with other display devices, the organic light emitting display devices have a fast response time, high emission efficiency, high luminance, and a broad viewing angle.

An organic light emitting device includes an organic emission layer which is formed between two electrodes. An electron and a positive hole are injected from the two electrodes into the organic emission layer, and an exciton is generated by combining the electron with the positive hole. The organic light emitting device is a device using the principle that light is emitted when the generated exciton is dropped from an excited state to a ground state.

Organic light emitting display devices for emitting white light can be applied to various fields such as backlights, illumination, etc. and are being recognized as important display devices.

Examples of a method where an organic light emitting display device realizes white may include a single layer emission method, a multilayer emission method, a color conversion method, an element stacked method, etc. The multilayer emission method among the methods is being used at present. In the multilayer emission method, lights are respectively emitted from a plurality of layers, and white is realized by a combination of colors.

An organic light emitting display device using the multilayer emission method includes two or more devices which have different peak wavelengths and are connected to each other. Due to two or more peak wavelengths, white light is emitted by a combination of emission areas having different peak wavelengths in a spectrum. However, since a peak wavelength of a spectrum is changed depending on a position at which an organic light emitting display device is seen, a color displayed on a screen of the organic light emitting display device is changed, and for this reason, it is difficult to realize a uniform screen of the organic light emitting display device.

SUMMARY OF THE INVENTION

Accordingly, the present invention is directed to provide an organic light emitting display device that substantially obviates one or more problems due to limitations and disadvantages of the related art.

Therefore, the inventors recognize the above-described problems and have done various experiments for solving a color defect or a color difference which occurs in an organic light emitting display device.

Through the various experiments, the inventors have invented a new organic light emitting display device for reducing a color defect or a color difference which occurs depending on positions at which an organic light emitting display device is seen.

An aspect of the present invention is directed to provide an organic light emitting display device in which a moving range of a peak wavelength of an electroluminescence (EL) spectrum of the organic light emitting display device is optimized, thereby reducing a color defect or a color difference which occurs in the front or side of the organic light emitting display device.

Another aspect of the present invention is directed to provide an organic light emitting display device that has a peak wavelength of EL spectrum (PWES) structure where a moving range of a peak wavelength of an EL spectrum of the organic light emitting display device is set, thereby reducing a color defect or a color difference which occurs in the front or side of the organic light emitting display device.

The objects of the present invention are not limited to the aforesaid, but other objects not described herein will be clearly understood by those skilled in the art from descriptions below.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display device including: a first electrode and a second electrode; and an organic layer between the first electrode and the second electrode, the organic layer including at least one emission part, wherein the organic layer is configured that a peak wavelength of an electroluminescence (EL) spectrum of the organic light emitting display device emitted from the emission part is within a range from 10 nm less to 10 nm more than a predetermined peak wavelength (i.e., a range from 10 nm less than the predetermined peak wavelength to 10 nm more than the predetermined peak wavelength). That is, in the present disclosure, "a range from Y less to Z more than K" means a range starting from Y less than K to Z more than K.

The emission part may include at least one emission layer, the at least one emission layer being one of a red emission layer, a green emission layer, and a blue emission layer.

A peak wavelength of an EL spectrum of red may be within a range of 600 nm to 650 nm. A peak wavelength of an EL spectrum of green is within a range of 520 nm to 550 nm. A peak wavelength of an EL spectrum of blue may be within a range of 450 nm to 480 nm. A total thickness of the organic layer may be within a range from 5% less to 5% more than a predetermined thickness.

The emission part may include at least one emission layer, which may include at least one host and a dopant, and a content of the dopant may be within a range from 50% less to 50% more than a predetermined content of the dopant.

The emission part may include two emission parts, the two emission parts may include a plurality of emission layers having a same wavelength range, and each of the plurality of emission layers having the same wavelength range may be one of a red emission layer, a green emission layer, and a blue emission layer.

The emission part may include two emission parts, the two emission parts may include a first emission part including a first emission layer and a second emission part including a second emission layer, the first emission layer may include one of a blue emission layer, a deep blue emission layer, and a sky blue emission layer, and the second emission layer may include one of a yellow-green emission layer, a green emission layer, a red emission layer and a yellow-green emission layer, and a red emission layer and a green emission layer.

A peak wavelength of an EL spectrum emitted from the first emission part may be within a range of 450 nm to 480 nm. A peak wavelength of an EL spectrum emitted from the second emission part may be within a range of 520 nm to 650 nm.

The organic light emitting display device may further include a P-type charge generation layer between the first emission part and the second emission part, the P-type charge generation layer including at least one host and a dopant, wherein a content of the dopant may be within a range from 50% less to 50% more than a predetermined content of the dopant.

The emission part may include three emission parts, the three emission parts may include a first emission part including a first emission layer, a second emission part including a second emission layer, and a third emission part including a third emission layer, the first emission layer may include one of a blue emission layer, a deep blue emission layer, and a sky blue emission layer, the second emission layer may include one of a yellow-green emission layer, a green emission layer, a red emission layer and a yellow-green emission layer, and a red emission layer and a green emission layer, and the third emission layer may include one of a blue emission layer, a deep blue emission layer, and a sky blue emission layer.

A peak wavelength of an EL spectrum emitted from each of the first emission part and the third emission part may be within a range of 450 nm to 480 nm. A peak wavelength of an EL spectrum emitted from the second emission part may be within a range of 520 nm to 650 nm.

The organic light emitting display device may further include: a first P-type charge generation layer between the first emission part and the second emission part; and a second P-type charge generation layer between the second emission part and the third emission part, wherein each of the first and second P-type charge generation layers may include at least one host and a dopant. A content of the dopant included in each of the first and second P-type charge generation layers may be within a range from 50% less to 50% more than a predetermined content of the dopant.

The organic layer may be configured that a peak wavelength of an EL spectrum of the organic light emitting display device emitted from the emission part satisfies X±8 nm corresponding to a range from 8 nm less to 8 nm more than the predetermined peak wavelength.

A total thickness of the organic layer may be within a range from 3% less to 3% more than a predetermined thickness.

The emission part may include at least one emission layer, which may include at least one host and a dopant, and a content of the dopant may be within a range from 50% less to 50% more than a predetermined content of the dopant.

The emission part may include: a first emission part and a second emission part; and a P-type charge generation layer between the first emission part and the second emission part, the P-type charge generation layer including at least one host and a dopant. A content of the dopant may be within a range from 50% less to 50% more than a predetermined content of the dopant.

The organic layer may be configured that a peak wavelength of an EL spectrum of the organic light emitting display device emitted from the emission part satisfies X±4 nm corresponding to a range from 4 nm less to 4 nm more than the predetermined peak wavelength.

A total thickness of the organic layer may be within a range from 3% less to 3% more than a predetermined thickness.

The emission part may include at least one emission layer, which may include at least one host and a dopant, and a content of the dopant may be within a range from 30% less to 30% more than a predetermined content of the dopant.

The at least one emission part may include: a first emission part and a second emission part; and a P-type charge generation layer between the first emission part and the second emission part, the P-type charge generation layer including at least one host and a dopant. A content of the dopant may be within a range from 30% less to 30% more than a predetermined content of the dopant.

In another aspect of the present invention, there is provided an organic light emitting display device including: a first electrode and a second electrode on a substrate, the first electrode being opposite to the second electrode; and at least one emission part between the first electrode and the second electrode, the emission part including at least one organic layer, wherein the at least one organic layer includes a peak wavelength of electroluminescence (EL) spectrum (PWES) structure where a moving range of a peak wavelength of an EL spectrum emitted from the emission part is set.

The PWES structure may have a range from −10 nm to +10 nm with respect to a front of the organic light emitting display device.

The PWES structure may have a range from −10 nm to +10 nm at a ±60-degree position with respect to a front of the organic light emitting display device.

The PWES structure may have a range from ±4 nm to ±8 nm at a front of the organic light emitting display device or a ±60-degree position with respect to the front of the organic light emitting display device.

A total thickness of the organic layer may be within a range from −5% to +5% of a predetermined thickness.

The emission part may include at least one emission layer, which may include at least one host and a dopant, and a content of the dopant may be within a range from −50% to +50% of a predetermined content of the dopant.

The emission part may include at least one emission layer being one of a red emission layer, a green emission layer, and a blue emission layer.

The emission part may include two emission parts, the two emission parts including a plurality of emission layers having a same wavelength range.

The at least one emission part may include two emission parts, the two emission parts including a plurality of emission layers having different wavelength ranges.

The organic light emitting display device may further include a P-type charge generation layer between the two emission parts, the P-type charge generation layer including at least one host and a dopant, wherein a content of the dopant may be within a range from −50% to +50% of a predetermined content of dopants.

The emission part may include three emission parts, the three emission parts may include a first emission part including a first emission layer, a second emission part including a second emission layer, and a third emission part including a third emission layer, and at least two emission layers of the first to third emission layers may have different wavelength ranges.

The organic light emitting display device may further include: a first P-type charge generation layer between the first emission part and the second emission part; and a second P-type charge generation layer between the second emission part and the third emission part, wherein each of the first and second P-type charge generation layers may include at least one host and a dopant, and a content of the dopant included in each of the first and second P-type charge generation layers may be within a range from +50% to −50% of a predetermined content of dopants.

Details of embodiments are included in a detailed description and the drawings.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
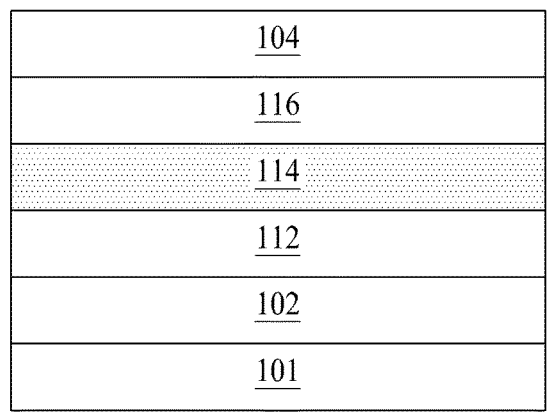
FIG. 1 is a schematic cross-sectional view illustrating an organic light emitting device according to a first embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, embodiments of the present invention will be described in detail with reference to the accompanying drawings.

FIG. 1 is a schematic cross-sectional view illustrating an organic light emitting device 100 according to a first embodiment of the present invention. The organic light emitting device 100 illustrated in FIG. 1 may have a patterned emission layer structure and may emit light having a mono color or the same wavelength range. The patterned emission layer structure may have a structure where a plurality of emission layers (for example, a red (R) emission layer, a green (G) emission layer, and a blue (B) emission layer) which respectively emit lights having different colors are divisionally provided in a plurality of pixels, respectively, and each of the plurality of pixels may emit light having a mono color or the same wavelength range. Each of the plurality of emission layers may be pattern-deposited in a corresponding pixel by using an opened mask (for example, a fine metal mask (FMM)). For convenience of description, only a structure where the organic light emitting device 100 is disposed in one pixel is illustrated in FIG. 1.

The organic light emitting device 100 illustrated in FIG. 1 may include first and second electrodes 102 and 104, a first hole transport layer (HTL) 112, a first emission layer (EML) 114, and a first electron transport layer (ETL) 116 which are disposed on a substrate 101. The first HTL 112, the first EML 114, and the first ETL 116 may be sequentially disposed between the first electrode 102 and the second electrode 104. That is, the organic light emitting device 100 may include at least one emission part disposed between the first electrode 102 and the second electrode 104. The at least one emission part may include the first HTL 112, the first EML 114, and the first ETL 116. The substrate 101 includes one of glass, metal, and plastic.

The first electrode 102 is an anode that supplies a hole, and may be formed of indium tin oxide (ITO), indium zinc oxide (IZO), or the like which is a transparent conductive material such as transparent conductive oxide (TCO). However, the present embodiment is not limited thereto. Alternatively, the first electrode 102 may be formed of gold (Au), silver (Ag), aluminum (Al), molybdenum (Mo), magnesium (Mg), lithium (Li), calcium (Ca), Ag—Mg, Mg—LiF, ITO, IZO, and/or the like, or may be formed of an alloy thereof. The first electrode 102 may be formed a single layer or a multilayer. However, the present embodiment is not limited thereto.

Moreover, the first electrode 102 may include a reflective layer in order for light, emitted from the first EML 114, not to be irradiated in a down direction through the first electrode 10. In detail, the first electrode 102 may have a three-layer structure where a first transparent layer, a reflective layer, and a second transparent layer are sequentially stacked. The first transparent layer and the second transparent layer may each be formed of TCO such as ITO, IZO, or the like. The reflective layer between two the transparent layers may be formed of a metal material such as copper (Cu), silver (Ag), palladium (Pd), or the like. For example, the reflective layer may be formed of ITO/Ag/ITO. Alternatively, the first electrode 102 may have a two-layer structure where a transparent layer and a reflective layer are stacked.

The second electrode 104 is a cathode that supplies an electron, and may be formed of Au, Ag, Al, Mo, Mg, Li, Ca, LiF, ITO, IZO, Ag—Mg, and/or the like, or may be formed of an alloy thereof. The second electrode 104 may be formed a single layer or a multilayer. However, the present embodiment is not limited thereto.

Each of the first electrode 102 and the second electrode 104 may be referred to as an anode or a cathode. Alternatively, the first electrode 102 may be formed as a transmissive electrode, and the second electrode 104 may be formed as a transflective electrode, i.e., a reflective and transmissive electrode. Alternatively, the first electrode 102 may be formed as a reflective electrode, and the second electrode 104 may be formed as a transflective electrode. Alternatively, the first electrode 102 may be formed as a transflective electrode, and the second electrode 104 may be formed as a transmissive electrode. Alternatively, at least one of the first and second electrodes 102 and 104 may be formed as a transflective electrode.

Moreover, a capping layer may be further formed on the second electrode 104, for protecting the organic light emitting device 100. Also, the capping layer may be omitted depending on a structure or a characteristic of the organic light emitting device 100.

The first HTL 112 may be formed of two or more layers, and a hole injection layer (HIL) may be further formed under the first HTL 112. The first HTL 112 may be formed of N,N'-bis(naphthalene-1-yl)-N,N'-bis(phenyl)-2,2'-dimethylbenzidine (NPD), N,N'-bis(naphthalene-1-yl)-N,N'-bis(phenyl)-benzidine (NPB), N,N'-bis(3-methylphenyl)-N,N'-bis(phenyl)-benzidine (TPD), and/or the like, but is not limited thereto. Also, the HIL may be formed of, for example, 2,3,5,6-tetrofluoro-7,7,8,8-tetracyano-quinodimethane (F4-TCNQ), copper complex (CuPc), and/or the like, but is not limited thereto.

Moreover, the first ETL 116 may be formed of two or more layers, and an electron injection layer (EIL) may be further formed on the first ETL 116. The first ETL 116 may be formed of, for example, tris(8-hydroxy-quinolonato)aluminum ($Alq_3$), 8-hydroxyquinolinolato-lithium (Liq), and/or the like, but is not limited thereto. The EIL may be formed of LiF and/or the like, but is not limited thereto.

The first HTL 112 may supply a hole, supplied from the first electrode 102, to the first EML 114. The first ETL 116 may supply an electron, supplied from the second electrode 104, to the first EML 114. Therefore, the hole supplied through the first HTL 112 and the electron supplied through the first ETL 116 may be recombined to generate an exciton in the first EML 114. An area (a zone) where the exciton is generated may be referred to as a recombination zone or an emission area (an emission zone).

The first EML 114 may be an EML having the same wavelength range. The EML having the same wavelength range may be formed as one of a red EML, a green EML, and a blue EML. The first EML 114 may be formed of at least one host and at least one dopant. The at least one host may include a hole-type host and an electron-type host. Alternatively, the at least one host may be a mixed host having two or more kinds of hosts. When the at least one host includes two or more kinds of hosts, the at least one host may include a hole-type host and an electron-type host. Also, the at least one dopant may include a phosphorescent dopant or a fluorescent dopant. In FIG. 1, the first EML 114 is illustrated as being formed of one EML. However, the first EML 114 may include a red EML, a green EML, and a blue EML which are respectively patterned in a red pixel, a green pixel, and a blue pixel.

When the first EML 114 is the red EML, a host constituting the first EML 114 may include one or more host materials, and examples of the host materials may include 4,4'-bis(carbozol-9-yl)biphenyl (CBP), 1,3-bis(carbazol-9-yl)benzene (MCP), N,N'-bis(naphthalene-1-yl)-N,N'-bis(phenyl)-2,2'-dimethylbenzidine (NPD), Be complex, and/or the like. A dopant constituting the first EML 114 may be a phosphorescent dopant, and examples of the phosphorescent dopant may include bis(2-benzo[b]thiophen-2-yl-pyridine)(acetylacetonate(iridium(III)) (Ir(btp)$_2$(acac)), bis(1-phenylisoquinoline)(acetylacetonate)iridium(III) (Ir(piq)$_2$(acac)), tris(1-phenylquinoline)iridium(III) (Ir(piq)$_3$), 5,10,15,20-tetraphenyltetrabenzoporphyrin platinum complex (Pt (TPBP)), and/or the like. Alternatively, the dopant constituting the first EML 114 may be a fluorescent dopant, and examples of the fluorescent dopant may include perylene and/or the like. The host material or the dopant material constituting the red EML does not limit details of the present invention. Also, when the first EML 114 is the red EML, a peak wavelength of light emitted from a first emission part 110 may be within a range of 600 nm to 650 nm.

When the first EML 114 is the green EML, a host constituting the first EML 114 may include one or more host materials, and examples of the host materials may include 4,4'-bis(carbozol-9-yl)biphenyl (CBP), 1,3-bis(carbazol-9-yl)benzene (MCP), N,N'-bis(naphthalene-1-yl)-N,N'-bis(phenyl)-2,2'-dimethylbenzidine (NPD), Be complex, and/or the like. A dopant constituting the first EML 114 may be a phosphorescent dopant, and examples of the phosphorescent dopant may include tris(2-phenylpyridine)iridium(III) (Ir(ppy)$_3$), Bis(2-phenylpyridine)(acetylacetonato)iridium(III) (Ir(ppy)$_2$(acac)), and/or the like. Alternatively, the dopant constituting the first EML 114 may be a fluorescent dopant, and examples of the fluorescent dopant may include tris(8-hydroxyquinolino)aluminum (Alq$_3$) and/or the like. The host material or the dopant material constituting the green EML does not limit details of the present invention. Also, when the first EML 114 is the green EML, a peak wavelength of light emitted from the first emission part 110 may be within a range of 520 nm to 550 nm.

When the first EML 114 is the blue EML, a host constituting the first EML 114 may include one or more host materials, and examples of the host materials may include 4,4'-bis(carbozol-9-yl)biphenyl (CBP), 1,3-bis(carbazol-9-yl)benzene (MCP), 9,10-di(naphth-2-yl)anthracene (ADN), and/or the like. A dopant constituting the first EML 114 may be a phosphorescent dopant, and examples of the phosphorescent dopant may include (Bis[2-(4,6-difluorophenyl)pyridinato-N]picolinato)iridium(III) (FIrpic) and/or the like. Alternatively, the dopant constituting the first EML 114 may be a fluorescent dopant, and examples of the fluorescent dopant may include polyfluorene (PFO)-based polymer, polyphenylenevinylene (PPV)-based polymer, and/or the like. The host material or the dopant material constituting the blue EML does not limit details of the present invention. Also, when the first EML 114 is the blue EML, a peak wavelength of light emitted from the first emission part 110 may be within a range of 450 nm to 480 nm.

The first HTL 112, the first EML 114, the first ETL 116, the HIL, the EIL, and the capping layer may each be referred to as an organic layer. Therefore, the at least one emission part may include at least one organic layer.

When the organic light emitting device 100 of FIG. 1 is applied to an organic light emitting display device, a display device including three pixels (for example, a red pixel, a green pixel, and a blue pixel) which each include a mono device may be implemented. Therefore, a display device which combines three primary colors of RGB to express various colors may be implemented. Also, an organic light emitting display device including the organic light emitting device 100 according to the first embodiment of the present invention may be applied to a bottom emission display device, a top emission display device, a dual emission display device, a lighting device for vehicles, and/or the like. The lighting device for vehicles may be at least one of headlights, a high beam, taillights, a brake light, a back-up light, a fog lamp, a turn signal light, and an auxiliary lamp, but is not limited thereto. Alternatively, the organic light emitting display device including the organic light emitting device 100 according to the first embodiment of the present invention may be applied to all indicator lamps which are used to secure a field of view of a driver and transmit or receive a signal of a vehicle. Also, the organic light emitting display device including the organic light emitting device 100 according to the first embodiment of the present invention may be applied to mobile equipment, monitors, televisions (TVs), and/or the like.

Figure 2:
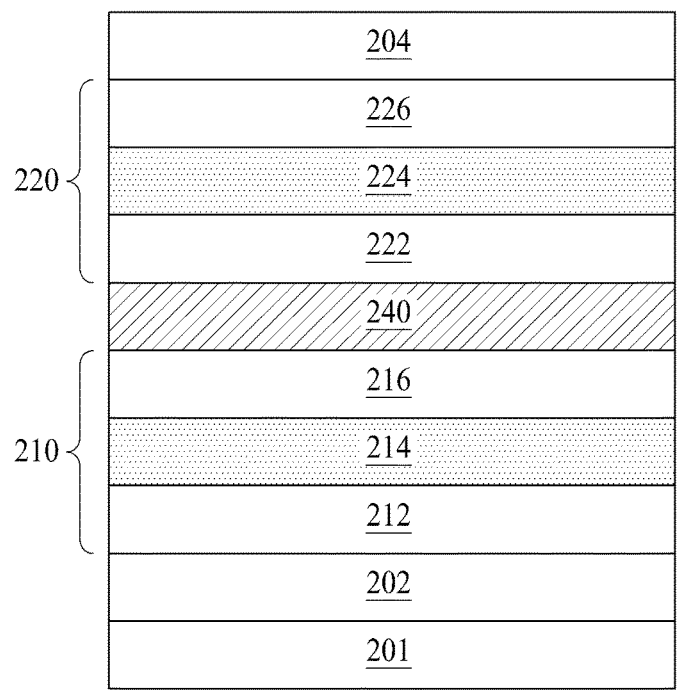
FIG. 2 is a schematic cross-sectional view illustrating an organic light emitting device according to a second embodiment of the present invention.

FIG. 2 is a schematic cross-sectional view illustrating an organic light emitting device 200 according to a second embodiment of the present invention. The organic light emitting device 200 illustrated in FIG. 2 may have a patterned emission layer structure and may emit light having a mono color or the same wavelength range. The patterned emission layer structure may have a structure where a plurality of emission layers (for example, a red (R) emission layer, a green (G) emission layer, and a blue (B) emission layer) which respectively emit lights having different colors are divisionally provided in a plurality of pixels, respectively, and each of the plurality of pixels may emit light having a mono color or the same wavelength range. Each of the plurality of emission layers may be pattern-deposited in a corresponding pixel by using an opened mask (for example, an FMM). For convenience of description, only a structure where the organic light emitting device 200 is disposed in one pixel is illustrated in FIG. 2. Also, the organic light emitting device 100 including one emission part is illustrated in FIG. 1, but the organic light emitting device 200 including two emission parts is illustrated in FIG. 2.

The organic light emitting device 200 according to the second embodiment of the present invention may include a substrate 201, a first electrode 202, a second electrode 204, and first and second emission parts 210 and 220 disposed between the first electrode 202 and the second electrode 204. The substrate 201, the first electrode 202, and the second electrode 204 illustrated in FIG. 2 may be substantially the same as the substrate 101, the first electrode 102, and the second electrode 104 described above with reference to FIG. 1. Thus, detailed descriptions of the substrate 201, first electrode 202, and second electrode 204 of FIG. 2 are omitted.

The first emission part 210 may include a first HTL 212, a first EML 214, and a first ETL 216 which are disposed on the first electrode 202.

An HIL may be further formed on the first electrode 202.

The first ETL 216 may be formed of two or more layers or two or more materials. Also, an EIL may be further formed on the first ETL 216.

The second emission part 220 may include a second HTL 222, a second EML 224, and a second ETL 226 which are disposed on the first emission part 210.

An HIL may be further formed under the second HTL 222.

The second ETL 226 may be formed of two or more layers or two or more materials. Also, an EIL may be further formed on the second ETL 226.

The first ETL 216 and the second ETL 226 may each be formed of the same material as that of the first ETL 116 described above with reference to FIG. 1, and the first HTL 212 and the second HTL 222 may each be formed of the same material as that of the first HTL 112 illustrated in FIG. 1. Also, the EIL of FIG. 2 may be formed of the same material as that of the EIL illustrated in FIG. 1, and the HIL of FIG. 2 may be formed of the same material as that of the HIL illustrated in FIG. 1.

A hole supplied through the second HTL 222 and an electron supplied through the second ETL 226 may be recombined to generate an exciton in the first EML 214. An area (a zone) where the exciton is generated may be referred to as a recombination zone or an emission area (an emission zone).

A hole supplied through the second HTL 222 and an electron supplied through the second ETL 226 may be recombined to generate an exciton in the second EML 224. An area (a zone) where the exciton is generated may be referred to as a recombination zone or an emission area (an emission zone).

Each of the first EML 214 and the second EML 224 may be an EML having the same wavelength range. The EML having the same wavelength range may be formed as one of a red EML, a green EML, and a blue EML. Each of the first EML 214 and the second EML 224 may be formed of at least one host and at least one dopant. The at least one host may include a hole-type host and an electron-type host. Alternatively, the at least one host may be a mixed host having two or more kinds of hosts. When the at least one host include two or more kinds of hosts, the at least one host may include a hole-type host and an electron-type host. Also, the at least one dopant may include a phosphorescent dopant or a fluorescent dopant. Details of the first EML 214 and the second EML 224 may be substantially the same as those of the first EML 114 described above with reference to FIG. 1, and thus, their detailed descriptions are not repeated. When each of the first EML 214 and the second EML 224 is a red EML, a peak wavelength (λmax) of light emitted from each of the first and second emission parts 210 and 220 may be within a range of 600 nm to 650 nm. Also, when each of the first EML 214 and the second EML 224 is a green EML, a peak wavelength (λmax) of light emitted from each of the first and second emission parts 210 and 220 may be within a range of 520 nm to 550 nm. Also, when each of the first EML 214 and the second EML 224 is a blue EML, a peak wavelength (λmax) of light emitted from each of the first and second emission parts 210 and 220 may be within a range of 450 nm to 480 nm. Also, in FIG. 2, each of the first EML 214 and the second EML 224 is illustrated as being formed of one EML. However, each of the first EML 214 and the second EML 224 may include a red EML, a green EML, and a blue EML which are respectively patterned in a red pixel, a green pixel, and a blue pixel.

A first charge generation layer (CGL) 240 may be further formed between the first emission part 210 and the second emission part 220. The first CGL 240 may adjust a balance of electrical charges between the first emission part 210 and the second emission part 220. The first CGL 240 may include a first N-type CGL and a first P-type CGL.

The first N-type CGL may inject an electron into the first EML 214. The first N-type CGL may be formed as an organic layer on which alkali metal such as lithium (Li), sodium (Na), potassium (K), or cesium (Cs) or alkali earth metal such as magnesium (Mg), strontium (Sr), barium (Ba), or radium (Ra) is doped, but is not limited thereto. Also, the first P-type CGL may inject a hole into the second EML 224. The first P-type CGL may be formed as an organic layer including a P-type dopant, but is not limited thereto.

Moreover, a capping layer may be further formed on the second electrode 204, for protecting the organic light emitting device 200. Also, the capping layer may be omitted depending on a structure or a characteristic of the organic light emitting device 200.

The first HTL 212, the first EML 214, the first ETL 216, the HIL, the EIL, the second HTL 212, the second EML 214, the second ETL 216, the first CGL 240, and the capping layer may each be referred to as an organic layer. Therefore, at least one emission part may include at least one organic layer.

In FIG. 2, the organic light emitting device 200 has been described as including two emission parts. However, the organic light emitting device 200 may be configured with three or more emission parts.

When the organic light emitting device 200 of FIG. 2 is applied to an organic light emitting display device, a display device including three pixels (for example, a red pixel, a green pixel, and a blue pixel) which each include a mono device may be implemented. Therefore, a display device which combines three primary colors of RGB to express various colors may be implemented. Also, an organic light emitting display device including the organic light emitting device 200 according to the second embodiment of the present invention may be applied to a bottom emission display device, a top emission display device, a dual emission display device, a lighting device for vehicles, and/or the like. The lighting device for vehicles may be at least one of headlights, a high beam, taillights, a brake light, a back-up light, a fog lamp, a turn signal light, and an auxiliary lamp, but is not limited thereto. Alternatively, the organic light emitting display device including the organic light emitting device 200 according to the second embodiment of the present invention may be applied to all indicator lamps which are used to secure a field of view of a driver and transmit or receive a signal of a vehicle. Also, the organic light emitting display device including the organic light emitting device 200 according to the second embodiment of the present invention may be applied to mobile equipment, monitors, televisions (TVs), and/or the like.

Figure 3:
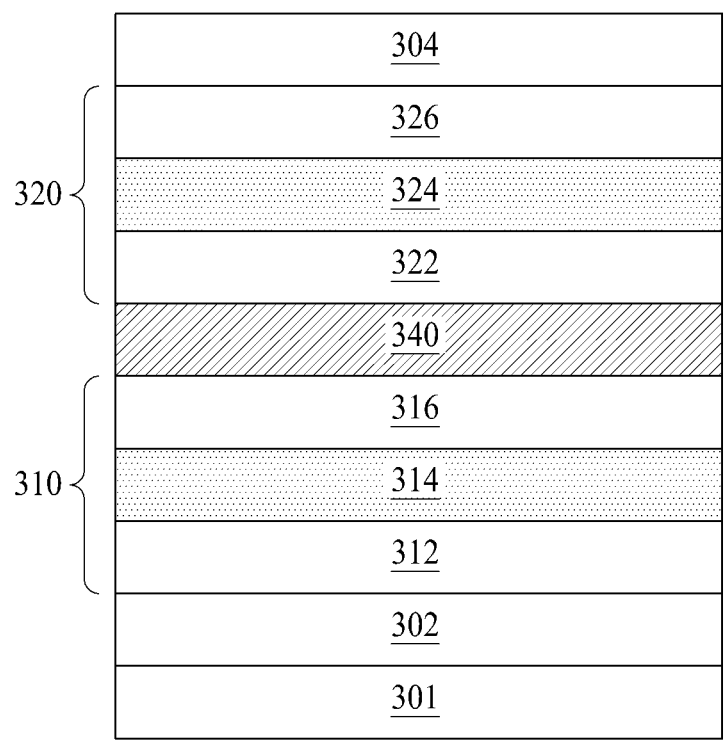
FIG. 3 is a schematic cross-sectional view illustrating an organic light emitting device according to a third embodiment of the present invention.

FIG. 3 is a schematic cross-sectional view illustrating an organic light emitting device 300 according to a third embodiment of the present invention.

The organic light emitting device 300 illustrated in FIG. 3 may include a first electrode 302, a second electrode 304, a first emission part 310, and a second emission part 320 which are disposed on a substrate 301. The first and second emission parts 310 and 320 may be disposed between the first electrode 302 and the second electrode 304. The substrate 301, the first electrode 302, and the second electrode 304 illustrated in FIG. 3 may be substantially the same as the substrate 101, the first electrode 102, and the second electrode 104 described above with reference to FIG. 1. Thus, detailed descriptions of the substrate 301, first electrode 302, and second electrode 304 of FIG. 3 are omitted.

The first emission part 310 may include a first HTL 312, a first EML 314, and a first ETL 316 which are disposed on the first electrode 302.

An HIL may be further formed on the first electrode 302 and enables a hole, supplied from the first electrode 302, to be smoothly injected into the first HTL 312. The first HTL 312 may supply a hole, supplied from the HIL, to the first EML 314. The first ETL 316 may supply an electron, received from the second electrode 304, to the first EML 314. Therefore, a hole supplied through the first HTL 312 and an electron supplied through the first ETL 316 may be recombined to generate an exciton in the first EML 314. An area (a zone) where the exciton is generated may be referred to as a recombination zone or an emission area (an emission zone).

The HIL may be formed of 4,4',4"-tris(3-methylphenylamino)triphenylamine (MTDATA), copper phthalocyanine (CuPc), poly(3,4-ethylenedioxythiphene, polystyrene sulfonate) (PEDOT/PSS), and/or the like, but is not limited thereto.

The first HTL 312 may be formed of two or more layers or two or more materials. The first HTL 312 may be formed of one or more materials among N,N'-bis(naphthalen-1-yl)-N,N'-bis(phenyl)-2,2'-dimethylbenzidine (NPD), N,N'-bis-(3-methylphenyl)-N,N'-bis-(phenyl)-benzidine (TPD), 2,2',7,7-tetrakis(N,N-diphenylamino)-9,9-spirofluorene (s-TAD), and 4,4',4"-Tris(N-3-methylphenyl-N-phenyl-amino)-triphenylamine (MTDATA), but is not limited thereto.

The first ETL 316 may be formed of two or more layers or two or more materials. The first ETL 316 may be formed of one or more materials among tris(8-hydroxy-quinolinato) aluminum (Alq3), 2-(4-biphenyl)-5-(4-tert-butylphenyl)-1,3,4-oxadiazole (PBD), 3-(4-biphenyl)4-phenyl-5-tert-butyl-phenyl-1,2,4-triazole (TAZ), spiro-PBD, bis(2-methyl-80quiolinolate)-4-(phenylphenolato)aluminium (BAlq), 8-hydroxyquinolinolato-lithium (Liq), 5,5'-bis(dimethylboryl)-2,2':5',2"-terthiophene (BMB-3T), perfluoro-2-naphthyl-substituted (PF-6P), 2,2',2"-(1,3,5-benzinetriyl)-tris(1-phenyl-1-H-benzimidazole) (TPBi), and cyclooctatetracene (COT), but is not limited thereto. Also, an EIL may be further formed on the first ETL 316.

The first EML 314 of the first emission part 310 may be formed as one of a blue EML, a deep blue EML, and a sky blue EML. A peak wavelength (λmax) of light emitted from the first emission part 310 may be within a range of 450 nm to 480 nm.

A host of the first EML 314 may include a single material or may be a mixed host having a mixed material. The mixed host may include a hole-type host and an electron-type host. For example, the host constituting the first EML 314 may be one among 4,4'-bis(carbozol-9-yl)biphenyl (CBP), 1,3-bis(carbazol-9-yl)benzene (MCP), N,N'-bis(naphthalene-1-yl)-N,N'-bis(phenyl)-2,2'-dimethylbenzidine (NPD), 2,2',7,7'-tetrakis(2,2-diphenylvinyl)-spiro-9,9'-bifluorene (spiro-DPVBi), spirobifluorene (spiro-6P), distyryl-benzene (DSB), distyryl arylene (DSA), polyfluorene (PFO)-based polymer, and polyphenylenevinylene (PPV)-based polymer or may be selected by mixing two or more materials thereof, but is not limited thereto.

Moreover, the dopant constituting the first EML 314 may include a pyrene-based material. In more detail, the dopant may include a pyrene-based compound substituted with an arylamine-based compound.

The first HTL 312, the first EML 314, the first ETL 316, the HIL, the EIL, a hole blocking layer (HBL), and an electron blocking layer (EBL) may each be referred to as an organic layer. Therefore, at least one emission part may include at least one organic layer.

The second emission part 320 may include a second HTL 322, a second EML 324, and a second ETL 326.

The second HTL 322 may be formed of the same material as that of the first HTL 112, but is not limited thereto. The second HTL 322 may be formed of two or more layers or two or more materials. Also, an HIL may be further formed under the second HTL 322.

The second ETL 326 may be formed of the same material as that of the first ETL 316, but is not limited thereto. The second ETL 326 may be formed of two or more layers or two or more materials. Also, an EIL may be further formed on the second ETL 326.

Moreover, the first EML 314 and the second EML 324 may be formed as EMLs having different wavelength ranges.

The second EML 324 may be formed as one of a yellow-green EML, a green EML, a red EML and a yellow-green EML, and a red EML and a green EML. When a red EML is further formed, the red efficiency of an organic light emitting display device is enhanced. When the second EML 324 is the yellow-green EML, a peak wavelength (λmax) of light emitted from the second emission part 320 may be within a range of 550 nm to 570 nm. Also, when the second EML 324 is the green EML, a peak wavelength (λmax) of light emitted from the second emission part 320 may be within a range of 520 nm to 550 nm. Also, when the second EML 324 is the red EML and the yellow-green EML, a peak wavelength (λmax) of light emitted from the second emission part 320 may be within a range of 550 nm to 650 nm. Also, when the second EML 324 is the red EML and the green EML, a peak wavelength (λmax) of light emitted from the second emission part 320 may be within a range of 520 nm to 650 nm.

A host of the second EML 324 may include a single material or may be a mixed host having a mixed material. The mixed host may include a hole-type host and an electron-type host. For example, the host constituting the second EML 324 may be formed of one material of 4,4',4"-tris(carbazol-9-yl)triphenylamine (TCTA), 4,4'-bis(carbazol-9-yl)biphenyl (CBP), bis(2-methyl-8-quinolinolate)-(4-phenylphenolato)aluminum (BAlq), and polyphenylenevinylene (PPV), but is not limited thereto. A dopant constituting the second EML 324 may be formed of an iridium-based compound, but is not limited thereto.

The second HTL 322, the second EML 324, the second ETL 326, the HIL, the EIL, the HBL, and the EBL may each be referred to as an organic layer. Therefore, at least one emission part may include at least one organic layer.

A first CGL 340 may be further formed between the first emission part 310 and the second emission part 320. The first CGL 340 may adjust a balance of electrical charges between the first emission part 310 and the second emission part 320. The first CGL 340 may include a first N-type CGL and a first P-type CGL.

The first N-type CGL may be formed as an organic layer on which alkali metal such as lithium (Li), sodium (Na), potassium (K), or cesium (Cs) or alkali earth metal such as magnesium (Mg), strontium (Sr), barium (Ba), or radium (Ra) is doped, but is not limited thereto. The first P-type CGL may be formed as an organic layer including a P-type dopant, but is not limited thereto. Also, the first CGL 340 may be formed of a single layer. Also, the first N-type CGL and the first P-type CGL which are included in the first CGL 340 may each be formed as an organic layer.

An organic light emitting display device including the organic light emitting device according to the third embodiment of the present invention may be a white organic light emitting display device that emits white light by using a first emission part including a first EML and a second emission part including a second EML. Therefore, when the organic light emitting device according to the third embodiment of the present invention is applied to an organic light emitting display device, the organic light emitting display device may be implemented as a white organic light emitting display device including four pixels (for example, a white pixel, a red pixel, a green pixel, and a blue pixel). Alternatively, when the organic light emitting device according to the third embodiment of the present invention is applied to an organic light emitting display device, the organic light emitting display device may be implemented as a white organic light emitting display device including three pixels (for example, a red pixel, a green pixel, and a blue pixel). Also, an organic light emitting display device including the organic light emitting device according to the third embodiment of the present invention may be applied to a bottom emission display device, a top emission display device, a dual emission display device, a lighting device for vehicles, and/or the like. The lighting device for vehicles may be at least one of headlights, a high beam, taillights, a brake light, a back-up light, a fog lamp, a turn signal light, and an auxiliary lamp, but is not limited thereto. Alternatively, the organic light emitting display device including the organic light emitting device according to the third embodiment of the present invention may be applied to all indicator lamps which are used to secure a field of view of a driver and transmit or receive a signal of a vehicle. Also, the organic light emitting display device including the organic light emitting device according to the third embodiment of the present invention may be applied to mobile equipment, monitors, televisions (TVs), and/or the like. In the organic light emitting display device including the organic light emitting device according to the third embodiment of the present invention, a pixel area may be defined on the substrate 301 by a gate line and a data line. A power line which extends in parallel with one of the gate line and the data line may be disposed on the substrate 301, and a switching thin film transistor (TFT) connected to the gate line or the data line and a driving TFT connected to the switching TFT may be disposed in the pixel area. The driving TFT may be connected to the first electrode 302.

Figure 4:
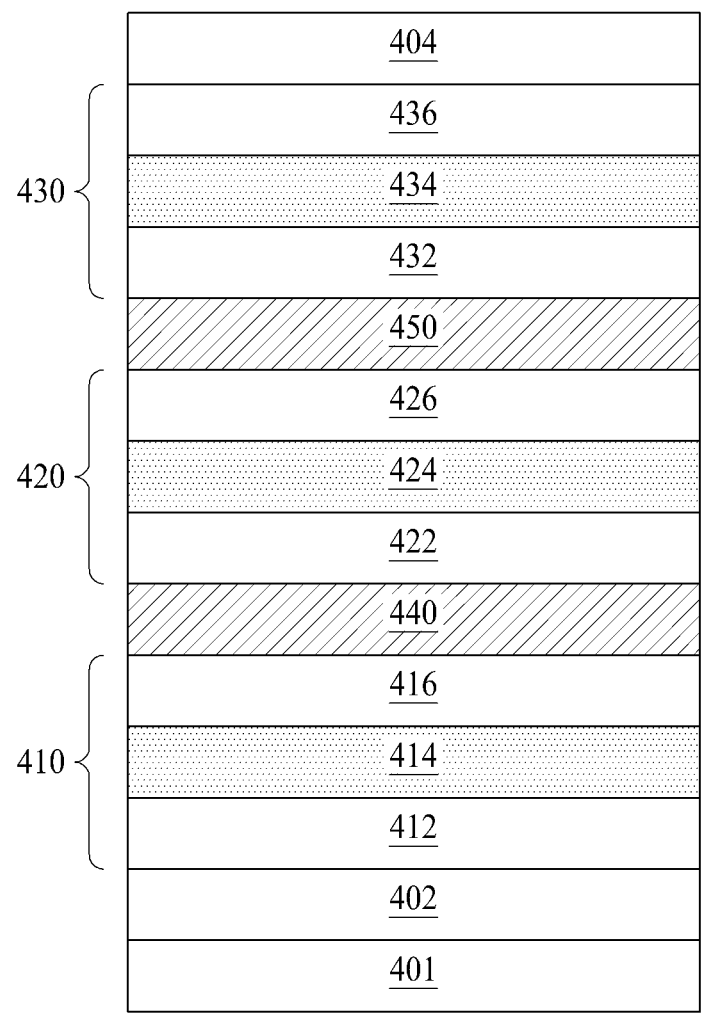
FIG. 4 is a schematic cross-sectional view illustrating an organic light emitting device according to a fourth embodiment of the present invention.

FIG. 4 is a schematic cross-sectional view illustrating an organic light emitting device 400 according to a fourth embodiment of the present invention.

The organic light emitting device 400 illustrated in FIG. 4 may include a first electrode 402, a second electrode 404, a first emission part 410, and a second emission part 420, and a third emission part 430 which are disposed on a substrate 401. The first to third emission parts 410 to 430 may be disposed between the first electrode 402 and the second electrode 404. The substrate 401, the first electrode 402, and the second electrode 404 illustrated in FIG. 4 may be substantially the same as the substrate 101, the first electrode 102, and the second electrode 104 described above with reference to FIG. 1. Thus, detailed descriptions of the substrate 401, first electrode 402, and second electrode 404 of FIG. 4 are omitted. Also, the first emission part 410 and second emission part 420 of FIG. 4 may be substantially the same as the first emission part 310 and second emission part 320 described above with reference to FIG. 3. Thus, detailed descriptions of the first emission part 410 and second emission part 420 of FIG. 4 are omitted.

The first emission part 410 may include a first HTL 412, a first EML 414, and a first ETL 416. Also, the first EML 414 may be formed as one of a blue EML, a deep blue EML, and a sky blue EML. A peak wavelength (λmax) of light emitted from the first emission part 410 may be within a range of 450 nm to 480 nm.

The second emission part 420 may include a second HTL 422, a second EML 424, and a second ETL 426. The second EML 424 may be formed as one of a yellow-green EML, a green EML, a red EML and a yellow-green EML, and a red EML and a green EML. When a red EML is further formed, the red efficiency of an organic light emitting display device is enhanced. When the second EML 424 is the yellow-green EML, a peak wavelength (λmax) of light emitted from the second emission part 420 may be within a range of 550 nm to 570 nm. Also, when the second EML 424 is the green EML, a peak wavelength (λmax) of light emitted from the second emission part 420 may be within a range of 520 nm to 550 nm. Also, when the second EML 424 is the red EML and the yellow-green EML, a peak wavelength (λmax) of light emitted from the second emission part 420 may be within a range of 550 nm to 650 nm. Also, when the second EML 424 is the red EML and the green EML, a peak wavelength (λmax) of light emitted from the second emission part 420 may be within a range of 520 nm to 650 nm.

A first CGL 440 may be further formed between the first emission part 410 and the second emission part 420. The first CGL 440 may adjust a balance of electrical charges between the first emission part 410 and the second emission part 420. The first CGL 440 may include a first N-type CGL and a first P-type CGL.

The first N-type CGL may be formed as an organic layer on which alkali metal such as lithium (Li), sodium (Na), potassium (K), or cesium (Cs) or alkali earth metal such as magnesium (Mg), strontium (Sr), barium (Ba), or radium (Ra) is doped, but is not limited thereto. The first P-type CGL may be formed as an organic layer including a P-type dopant, but is not limited thereto. Also, the first CGL 440 may be formed of a single layer.

The third emission part 430 may include a third HTL 432, a third EML 434, and a third ETL 436 which are disposed on the second emission part 420.

An HIL may be further formed under the third HTL 432.

The third HTL 432 may be formed of N,N'-bis(naphthalene-1-yl)-N,N'-bis(phenyl)-2,2'-dimethylbenzidine (NPD), N,N'-bis(naphthalene-1-yl)-N,N'-bis(phenyl)-benzidine (NPB), and/or the like, but is not limited thereto. Also, the third HTL 432 may be formed of two or more layers or two or more materials.

An EIL may be further formed on the third ETL 436.

The third ETL 436 may be formed of the same material as that of the first ETL 416, but is not limited thereto. The third ETL 436 may be formed of two or more layers or two or more materials.

The third EML 434 of the third emission part 430 may be formed as one of a blue EML, a deep blue EML, and a sky blue EML. A peak wavelength (λmax) of light emitted from the third emission part 434 may be within a range of 450 nm to 480 nm.

A host of the third EML 434 may include a single material or may be a mixed host having a mixed material. The mixed host may include a hole-type host and an electron-type host. For example, the host constituting the third EML 434 may be one of 4,4'-bis(carbozol-9-yl)biphenyl (CBP), 1,3-bis (carbazol-9-yl)benzene (MCP), N,N'-bis(naphthalene-1-yl)-N,N'-bis(phenyl)-2,2'-dimethylbenzidine (NPD), 2,2',7,7'-tetrakis(2,2-diphenylvinyl)-spiro-9,9'-bifluorene (spiro-DPVBi), spirobifluorene (spiro-6P), distyryl-benzene (DSB), distyryl arylene (DSA), polyfluorene (PFO)-based polymer, and polyphenylenevinylene (PPV)-based polymer or may be selected by mixing two or more materials thereof, but is not limited thereto.

Moreover, the dopant constituting the third EML 434 may include a pyrene-based material. In more detail, the dopant may include a pyrene-based compound substituted with an arylamine-based compound.

A second CGL 450 may be further formed between the second emission part 420 and the third emission part 430. The second CGL 450 may adjust a balance of electrical charges between the second emission part 420 and the third emission part 430. The second CGL 450 may include a second N-type CGL and a second P-type CGL.

The second N-type CGL may inject an electron into the second emission part 420, and the second P-type CGL may inject a hole into the third emission part 430. The second N-type CGL may be formed as an organic layer on which alkali metal such as lithium (Li), sodium (Na), potassium (K), or cesium (Cs) or alkali earth metal such as magnesium (Mg), strontium (Sr), barium (Ba), or radium (Ra) is doped, but is not limited thereto. The second P-type CGL may be formed as an organic layer including a P-type dopant, but is not limited thereto. The first N-type CGL and first P-type CGL of the first CGL 440 may be formed of the same material as that of the second N-type CGL and second P-type CGL of the second CGL 450, but are not limited thereto. Also, the second CGL 450 may be formed of a single layer.

The first HTL 412, the first EML 414, the first ETL 416, the second HTL 422, the second EML 424, the second ETL 426, the third HTL 432, the third EML 434, the third ETL 436, the first CGL 440, the second CGL 450, the HIL, the EIL, the HBL, and the EBL may each be referred to as an organic layer. Therefore, at least one emission part may include at least one organic layer. Also, at least two of the first to third EMLs 414, 424 and 434 may be formed as EMLs having different wavelength ranges.

In FIG. 4, the organic light emitting device 400 has been described as including three emission parts. However, the organic light emitting device 400 may be configured with four or more emission parts.

An organic light emitting display device including the organic light emitting device according to the fourth embodiment of the present invention may be a white organic light emitting display device that emits white light by using a first emission part including a first EML, a second emission part including a second EML, and a third emission part including a third EML. Therefore, when the organic light emitting device according to the fourth embodiment of the present invention is applied to an organic light emitting display device, the organic light emitting display device may be implemented as a white organic light emitting display device including four pixels (for example, a white pixel, a red pixel, a green pixel, and a blue pixel). Alternatively, when the organic light emitting device according to the fourth embodiment of the present invention is applied to an organic light emitting display device, the organic light emitting display device may be implemented as a white organic light emitting display device including three pixels (for example, a red pixel, a green pixel, and a blue pixel). Also, an organic light emitting display device including the organic light emitting device according to the fourth embodiment of the present invention may be applied to a bottom emission display device, a top emission display device, a dual emission display device, a lighting device for vehicles, and/or the like. The lighting device for vehicles may be at least one of headlights, a high beam, taillights, a brake light, a back-up light, a fog lamp, a turn signal light, and an auxiliary lamp, but is not limited thereto. Alternatively, the organic light emitting display device including the organic light emitting device according to the fourth embodiment of the present invention may be applied to all indicator lamps which are used to secure a field of view of a driver and transmit or receive a signal of a vehicle. Also, the organic light emitting display device including the organic light emitting device according to the fourth embodiment of the present invention may be applied to mobile equipment, monitors, televisions (TVs), and/or the like. In the organic light emitting display device including the organic light emitting device according to the fourth embodiment of the present invention, a pixel area may be defined on the substrate 401 by a gate line and a data line. A power line which extends in parallel with one of the gate line and the data line may be disposed on the substrate 401, and a switching TFT connected to the gate line or the data line and a driving TFT connected to the switching TFT may be disposed in the pixel area. The driving TFT may be connected to the first electrode 402. This will be described below with reference to FIG. 5.

Figure 5:
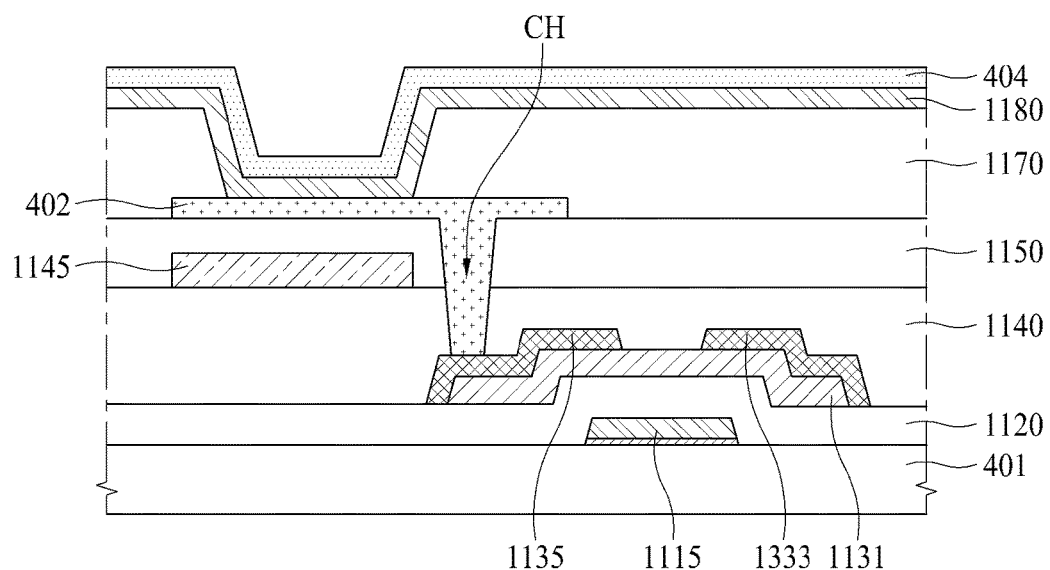
FIG. 5 is a schematic cross-sectional view illustrating an example of an organic light emitting display device according to the fourth embodiment of the present invention.

FIG. 5 is a schematic cross-sectional view illustrating an example of an organic light emitting display device 1000 according to the fourth embodiment of the present invention. An example of the organic light emitting display device 1000 illustrated in FIG. 5 does not limit details of the present invention, and may be applied to a top emission display device, a dual emission display device, etc.

As illustrated in FIG. 5, the organic light emitting device 1000 according to the fourth embodiment of the present invention includes a substrate 401, a thin film transistor TFT, an overcoating layer 1150, a first electrode 402, an emission part 1180, and a second electrode 404.

The substrate 401 may be formed of glass, metal, or plastic.

The thin film transistor TFT may be formed on the substrate 401. The thin film transistor TFT may include a gate electrode 1115, a gate insulation layer 1120, a semiconductor layer 1131, a source electrode 1133, a drain electrode 1135, and a passivation layer 1140.

The gate electrode 1115 may be formed on the substrate 401 and may be connected to a gate line. The gate electrode 1115 may include a multilayer formed of one material among molybdenum (Mo), aluminum (Al), chromium (Cr), gold (Au), titanium (Ti), nickel (Ni), neodymium (Nd), and copper (Cu) or an alloy thereof. In FIG. 5, the gate electrode 1115 are formed of two layers, but is not limited thereto.

The gate insulation layer 1120 may be formed on the gate electrode 1115 and may be formed of silicon oxide (SiOx), silicon nitride (SiNx), or a multilayer thereof, but is not limited thereto.

The semiconductor layer 1131 may be formed on the gate insulation layer 1120, and may be formed of amorphous silicon (a-Si), polycrystalline silicon (poly-Si), oxide semiconductor, or organic semiconductor. When the semiconductor layer 1131 is formed of oxide semiconductor, the semiconductor layer 1131 may be formed of indium tin oxide (ITO), indium zinc oxide (IZO), or indium tin zinc oxide (ITZO), but is not limited thereto. Also, an etch stopper (not shown) may be formed on the semiconductor layer 1131 and may protect the semiconductor layer 1131, but may be omitted depending on a configuration of a device.

The source electrode 1133 and the drain electrode 1135 may be formed on the semiconductor layer 1131. The source electrode 1133 and the drain electrode 1135 may be formed of a single layer or a multilayer, and may be formed of one material among molybdenum (Mo), aluminum (Al), chromium (Cr), gold (Au), titanium (Ti), nickel (Ni), neodymium (Nd), and copper (Cu) or an alloy thereof.

The passivation layer 1140 may be formed on the source electrode 1133 and the drain electrode 1135, and may be formed of SiOx, SiNx, or a multilayer thereof. Alternatively, the passivation layer 1140 may be formed of an acryl resin or a polyimide resin, but is not limited thereto.

In FIG. 5, the thin film transistor TFT is illustrated as having an inverted staggered structure, but may be formed in a coplanar structure.

A color filter 1145 may be formed on the passivation layer 1140, and although only one sub-pixel is illustrated in the drawing, the color filter 1145 may be formed in each of a red sub-pixel, a blue sub-pixel, and a green sub-pixel. The color filter 1145 may include a red (R) color filter, a green (G) color filter, and a blue (B) color filter which are patterned and formed in respective sub-pixels. The color filter 1145 transmits light having only a specific wavelength among white lights emitted from the emission part 1180.

The overcoating layer 1150 may be formed on the color filter 1145 and may be formed of an acryl resin, a polyimide resin, SiOx, SiNx, or a multilayer thereof, but is not limited thereto.

The first electrode 402 may be formed on the overcoating layer 1150 and may be formed of indium tin oxide (ITO) or indium zinc oxide (IZO) which is a transparent conductive material such as transparent conductive oxide (TCO), but is not limited thereto. Alternatively, the first electrode 402 may be formed of gold (Au), silver (Ag), aluminum (Al), molybdenum (Mo), magnesium (Mg), lithium (Li), calcium (Ca), Ag—Mg, Mg—LiF, ITO, IZO, and/or the like, or may be formed of an alloy thereof. The first electrode 402 may be formed a single layer or a multilayer. However, the present embodiment is not limited thereto.

The first electrode 402 may be electrically connected to the drain electrode 1135 through a contact hole CH which is formed in a certain area of the passivation layer 1140 and the overcoating layer 1150. In FIG. 5, the drain electrode 1135 is illustrated as being electrically connected to the first electrode 402, but the present embodiment is not limited thereto. As another example, the source electrode 1133 may be electrically connected to the first electrode 402 through the contact hole CH which is formed in the certain area of the passivation layer 1140 and the overcoating layer 1150.

A bank layer 1170 may be formed on the first electrode 402 and may be formed of an organic material such as a benzocyclobutene (BCB) resin, an acryl resin, a polyimide resin, and/or the like. The bank layer 1180 may be formed on the first electrode 402 to have a certain opening in order for light emitted from the emission part 1180 to pass through the bank layer 1180.

The bank layer 1170 may be formed of a photosensitive material containing a black pigment. In this case, the bank layer 1170 may act as a light blocking member.

The emission part 1180 may be formed on the bank layer 1170. As illustrated in FIG. 3, the emission part 1180 may include the first emission part 310 and the second emission part 320 which are formed on the first electrode 402. Alternatively, as illustrated in FIG. 4, the emission part 1180 may include the first emission part 410, the second emission part 420, and the third emission part 430 which are formed on the first electrode 402.

The second electrode 404 may be formed on the emission part 1180 and may be formed of Au, Ag, Al, Mo, Mg, Li, Ca, LiF, ITO, IZO, Ag—Mg, and/or the like, or may be formed of an alloy thereof. The second electrode 404 may be formed a single layer or a multilayer. However, the present embodiment is not limited thereto.

Moreover, an encapsulation layer (not shown) may be further formed on the second electrode 404. The encapsulation layer prevents moisture from penetrating into the emission part 1180. The encapsulation layer may include a plurality of layers where different inorganic materials are stacked, or include a plurality of layers where an inorganic material and an organic material are alternately stacked. Also, an encapsulation substrate (not shown) may be further formed on the encapsulation layer. The encapsulation substrate may be formed of glass, plastic, or metal. The encapsulation substrate may be adhered to the encapsulation layer by an adhesive.

The organic light emitting display device illustrated in FIG. 5 relates to a bottom emission display device where the light emitted from the emission part 1180 travels in a direction toward the substrate 401, but the present invention is not limited thereto. The present invention may be applied to a top emission display device where the light emitted from the emission part 1180 travels in a direction toward the second electrode 404. In a top emission type, the color filter 1145 may be formed on the second electrode 404. Alternatively, the present invention may be applied to a dual emission display device.

The inventors have recognized that a color difference occurs in a screen of the organic light emitting display device illustrated in FIGS. 1 to 4 depending on positions of the screen of the organic light emitting display device or angles at which the screen is seen.

The inventors have measured a peak wavelength ($\lambda$max) in each of the front and side of the organic light emitting display device, for checking a color difference which occurs in the screen of the organic light emitting display device depending on positions of the screen of the organic light emitting display device or angles at which the screen is seen.

Figure 6A:
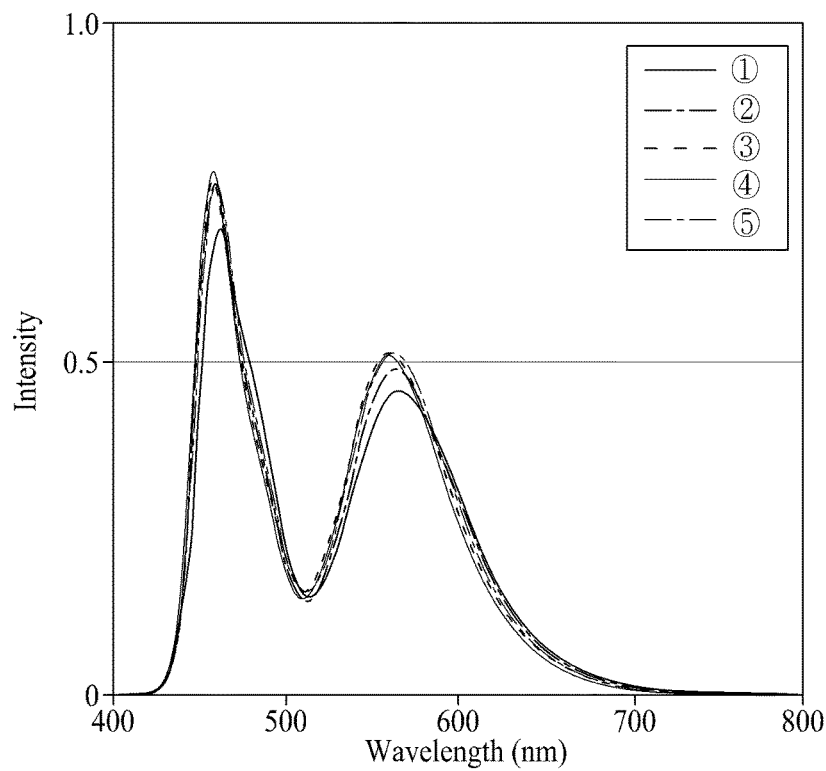
FIGS. 6A and 6B are diagrams showing EL spectrums of the organic light emitting display device according to the fourth embodiment of the present invention.
Figure 6B:
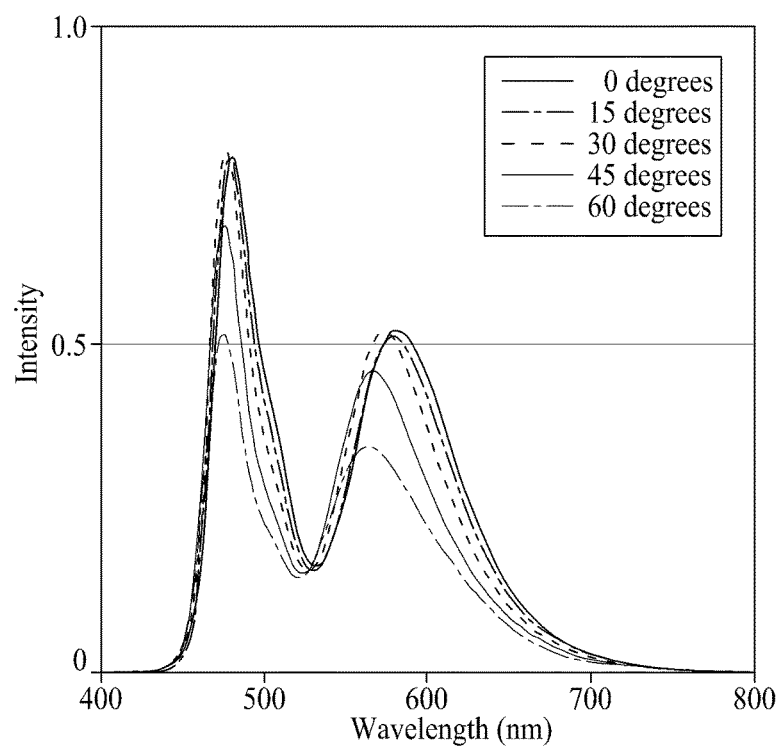

FIGS. 6A and 6B are diagrams showing EL spectrums of the organic light emitting display device according to the fourth embodiment of the present invention.

Here, a wavelength at which each of the organic layers respectively configuring the first to fourth emission parts emits unique light may be referred to as photoluminescence (PL), and light which is emitted to the organic light emitting display device when PL is affected by a cavity peak which is optical characteristic may be referred to as electroluminescence (EL). The EL spectrums of FIGS. 6A and 6B may be spectrums which are shown by measuring light emitted to the organic light emitting display device with a luminance meter. The EL spectrums may each be expressed as multiplication of PL and an emittance spectrum which is changed depending on optical characteristic and a thickness of each of the organic layers. Also, a peak wavelength ($\lambda$max) denotes a maximum wavelength of EL. Also, the cavity peak denotes a point where a transmittance is optically the maximum.

In FIGS. 6A and 6B, the abscissa axis indicates a wavelength range (nm) of light, and the ordinate axis indicates emission intensity (a.u., arbitrary unit). The emission intensity may be a numerical value which is expressed as a relative value with respect to a maximum value of an EL spectrum. That is, 0.8 a.u. that is a value of an EL spectrum of blue may be set as a maximum value, and the emission intensity may be expressed by converting a value of an EL spectrum of yellow-green.

FIG. 6A is an EL spectrum which is obtained through measurement based on positions in the screen of the organic light emitting display device, and FIG. 6B is an EL spectrum which is obtained through measurement based on angles at which the organic light emitting display device is seen.

FIG. 6A shows a measurement result which is obtained by measuring the organic light emitting display device which is divided into five equal parts from a left side position ①, ② to a right side position ④, ⑤ with reference to a central position ③ of the organic light emitting display device. The measurement result may be obtained by measuring the five equal parts from a left side position ① to a right side position ⑤ of the organic light emitting display device.

As shown in FIG. 6A, it can be seen that a peak wavelength (λmax) of the EL spectrum is moved based on positions of the organic light emitting display device. A peak wavelength (λmax) of the EL spectrum of blue is within a range of 450 nm to 480 nm, and in the range, it can be seen that as a position get closer from a left side position ① to a right side position ⑤ of a screen of the organic light emitting display device, a peak wavelength is moved to a short wavelength. And, a peak wavelength (λmax) of the EL spectrum of Yellow-Green is within a range of 550 nm to 570 nm, and in the range, it can be seen that as a position gets closer from a left side position ① to a right side position ⑤ of a screen, a peak wavelength is moved to a short wavelength.

FIG. 6B shows results which are obtained by measuring a wavelength while changing an angle with respect to the front of the organic light emitting display device (an angle corresponding to a viewing direction perpendicular to the display device surface being defined as 0 degree), and shows the results which are obtained by measuring the wavelength at 0 degrees, 15 degrees, 30 degrees, 45 degrees, and 60 degrees. Here, the wavelength may be measured at 0 degree, 15 degrees, 30 degrees, 45 degrees, and 60 degrees, but an angle at which the organic light emitting display device is seen may be changed depending on users. The angles at which the wavelength is measured do not limit details of the present invention.

As shown in FIG. 6B, considering the results obtained through the measurement based on the angles at which the organic light emitting display device is seen, it can be seen that the peak wavelength (λmax) of the EL spectrum of the organic light emitting display device is moved based on angles at which the organic light emitting display device is seen. The peak wavelength (λmax) of the EL spectrum of blue is within a range of 450 nm to 480 nm, and in the range, it can be seen that as a position get closer from 0 degrees to 60 degrees, a peak wavelength is moved to a short wavelength. Also, the peak wavelength (λmax) of the EL spectrum of yellow-green is within a range of 550 nm to 570 nm, and in the range, it can be seen that as a position get closer from 0 degrees to 60 degrees, a peak wavelength is moved to a short wavelength and deviates from the range of 550 nm to 570 nm which is a peak wavelength (λmax). Therefore, since the peak wavelength (λmax) of the EL spectrum of blue and the peak wavelength (λmax) of the EL spectrum of yellow-green are differently changed based on angles at which the organic light emitting display device is seen, it is difficult to realize a screen of an organic light emitting display device displaying a uniform color. Also, the peak wavelength (λmax) of the EL spectrum of yellow-green is further moved to a short wavelength than the peak wavelength (λmax) of the EL spectrum of blue depending on angles at which the organic light emitting display device is seen, color coordinates are changed. For this reason, it is unable to realize desired color coordinates, and consequently, it is unable to realize a screen displaying a uniform color, based on positions of the screen of the organic light emitting display device or angles at which the screen is seen.

Therefore, when the organic light emitting display device is seen from the front and a side thereof, a difference between peak wavelengths of EL spectrums occurs, and thus, it can be seen that a color difference occurs in the screen of the organic light emitting display device depending on positions of the screen or angles at which the screen is seen. Also, FIGS. 6A and 6B show results which are obtained by measuring a bottom emission display device as an example. Also, even in a top emission display device and a dual emission display device, a color difference can occur in the screen of the organic light emitting display device depending on positions of the screen or angles at which the screen is seen.

Therefore, the inventors have reviewed a cause of a difference between peak wavelengths of EL spectrums which occurs in the front and side of an organic light emitting display device. A peak wavelength of an EL spectrum of an organic light emitting display device may be affected by a total thickness of organic layers affecting an emittance peak, a content of dopants included in a CGL, a content of dopants included in an EML affecting PL, and/or the like. Therefore, the inventors have experimented on a total thickness of organic layers, a content of dopants included in a CGL, a content of dopants included in an EML, which affect a peak wavelength of an EL spectrum of an organic light emitting display device.

Figure 9:
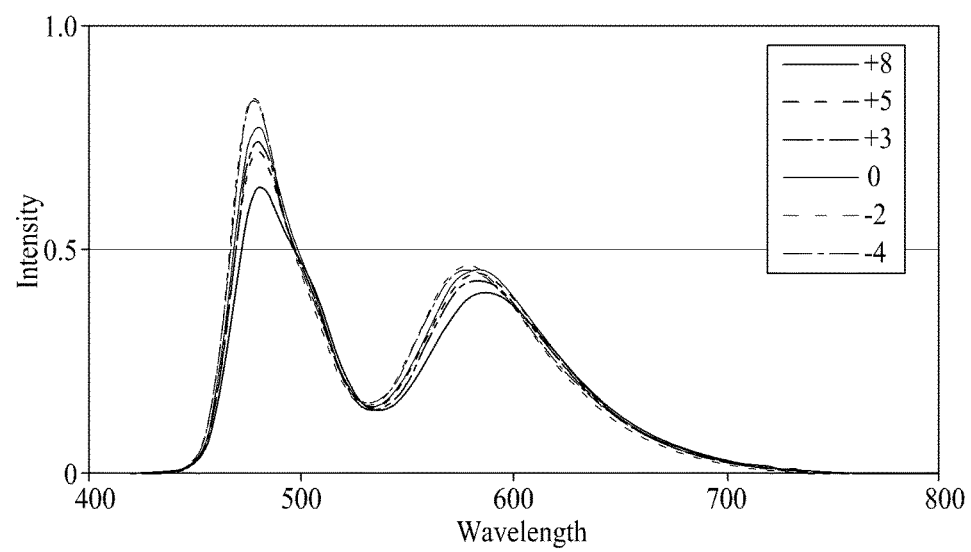
FIG. 9 is a diagram showing an EL spectrum based on a total thickness of organic layers in the fourth embodiment of the present invention.
Figure 10:
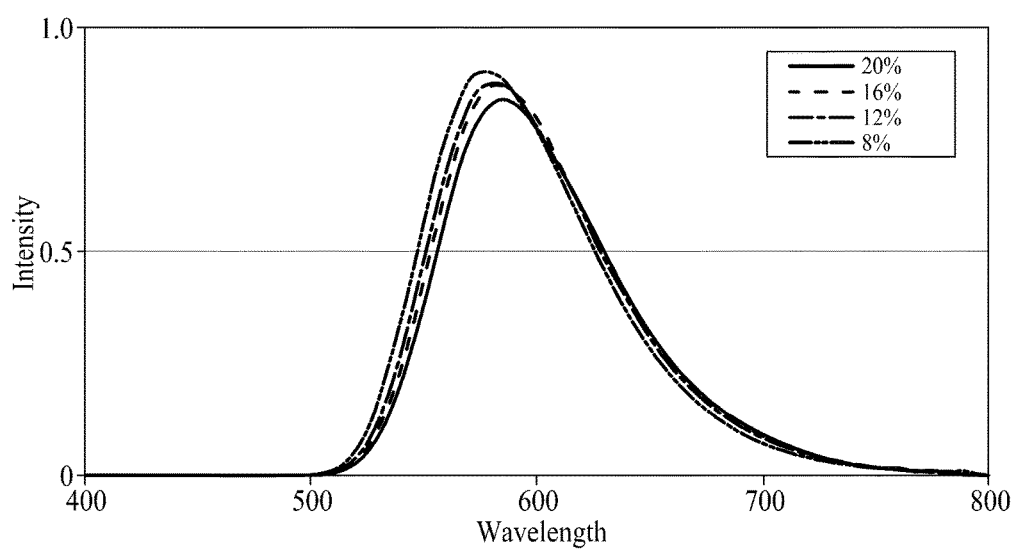
FIG. 10 is a diagram showing an EL spectrum based on a dopant content of an emission layer in the fourth embodiment of the present invention.
Figure 11:
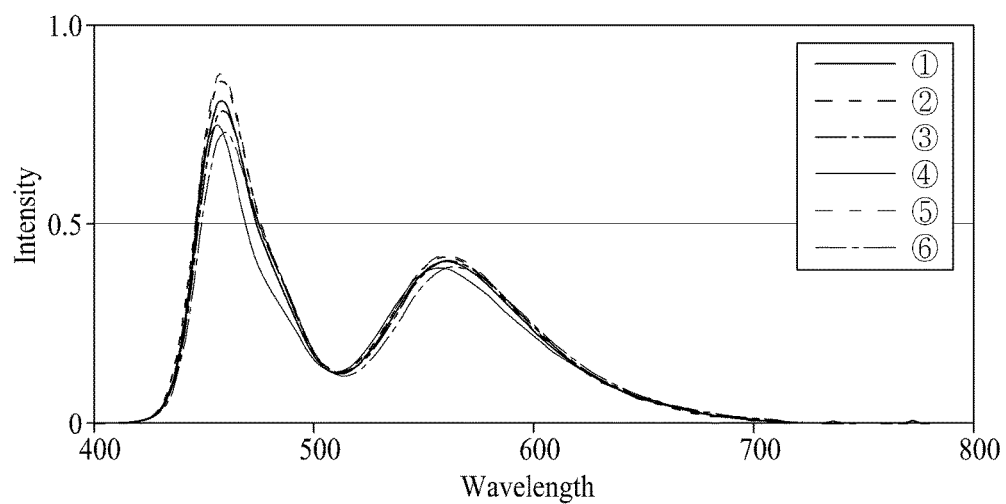
FIG. 11 is a diagram showing an EL spectrum based on a content of dopants included in a charge generation layer in the fourth embodiment of the present invention.

This will be described with reference to the following Tables 1 to 5 and FIGS. 7A to 11. FIGS. 7A to 7C and 8A to 8C show results which are obtained through measurement performed for an organic light emitting display device including the organic light emitting device of FIG. 1. Also, experiment results shown in FIGS. 9 to 11 are obtained through measurement performed for an organic light emitting display device including the organic light emitting device of FIG. 4. Also, the following Tables 1 and 2 and FIGS. 7A to 7C and 8A to 8C show results obtained through measurement performed for a top emission display device as an example. However, even in a bottom emission display device and a dual emission display device, a peak wavelength of an EL spectrum is affected by a total thickness of organic layers and a content of dopants included in an EML, and thus, the substantially same results may be obtained through measurement.

The following Table 1 shows a peak wavelength (λmax) of an EL spectrum of an organic light emitting display device based on a total thickness of organic layers.

TABLE 1

| Total thickness of organic layers | R | G | B |
|---|---|---|---|
| +5 nm | 644 nm | 552 nm | 476 nm |
| 0 nm | 640 nm | 544 nm | 472 nm |
| −5 nm | 632 nm | 540 nm | 472 nm |

In Table 1, the total thickness of the organic layers denotes a thickness of organic layers disposed between a first electrode and a second electrode except a thickness of the first and second electrodes. Also, Table 1 shows results obtained through measurement performed for an organic light emitting display device including the organic light emitting device of FIG. 1, and for example, in red, the total thickness of the organic layers may be 290 nm, but does not limit details of the present invention. With 290 nm as a criterion, 290 nm may correspond to 0 nm, and +5 nm may correspond to 295 nm by forming an organic layer to a thickness which is 5 nm thicker than 290 nm. −5 nm may correspond to 285 nm by forming an organic layer to a thickness which is 5 nm thinner than 290 nm. Also, for example, in green, the total thickness of the organic layers may be 230 nm, but does not limit the details of the present invention. With 230 nm as a criterion, 230 nm may correspond to 0 nm, and +5 nm may correspond to 235 nm by forming an organic layer to a thickness which is 5 nm thicker than 230 nm. −5 nm may correspond to 225 nm by forming an organic layer to a thickness which is 5 nm thinner than 230 nm. Also, for example, in blue, the total thickness of the organic layers may be 180 nm, but does not limit the details of the present invention. With 180 nm as a criterion, 180 nm may correspond to 0 nm, and +5 nm may correspond to 185 nm by forming an organic layer to a thickness which is 5 nm thicker than 180 nm. −5 nm may correspond to 175 nm by forming an organic layer to a thickness which is 5 nm thinner than 180 nm.

As shown in Table 1, a peak wavelength (λmax) of an EL spectrum of red may have a range of 632 nm to 644 nm depending on a change in the total thickness of the organic layers. In a case where 640 nm which is the peak wavelength (λmax) of the EL spectrum of red when the total thickness of the organic layers is 0 nm is a criterion, when the total thickness of the organic layers is thickened, a peak wavelength of red may be moved by +4 nm from 640 nm to 644 nm. In the case where 640 nm which is the peak wavelength (λmax) of the EL spectrum of red when the total thickness of the organic layers is 0 nm is the criterion, when the total thickness of the organic layers is thinned, the peak wavelength of red may be moved from 640 nm to 632 nm, and thus, a peak wavelength difference of −8 nm occurs. Accordingly, it can be seen that the peak wavelength of red is moved between −8 nm to +4 nm.

Moreover, as shown in Table 1, a peak wavelength (λmax) of an EL spectrum of green may have a range of 540 nm to 552 nm depending on a change in the total thickness of the organic layers. In a case where 544 nm which is the peak wavelength (λmax) of the EL spectrum of green when the total thickness of the organic layers is 0 nm is a criterion, when the total thickness of the organic layers is thickened, a peak wavelength of green may be moved by +8 nm from 544 nm to 552 nm. In the case where 544 nm which is the peak wavelength (λmax) of the EL spectrum of green when the total thickness of the organic layers is 0 nm is the criterion, when the total thickness of the organic layers is thinned, the peak wavelength of green may be moved from 544 nm to 540 nm, and thus, a peak wavelength difference of −4 nm occurs. Accordingly, it can be seen that the peak wavelength of green is moved between −4 nm to +8 nm.

Moreover, as shown in Table 1, a peak wavelength (λmax) of an EL spectrum of blue may have a range of 472 nm to 476 nm depending on a change in the total thickness of the organic layers. In a case where 472 nm which is the peak wavelength (λmax) of the EL spectrum of blue when the total thickness of the organic layers is 0 nm is a criterion, when the total thickness of the organic layers is thickened, a peak wavelength of blue may be moved from 472 nm to 476 nm, and thus, a peak wavelength difference of +4 nm occurs. In the case where 472 nm which is the peak wavelength (λmax) of the EL spectrum of blue when the total thickness of the organic layers is 0 nm is the criterion, when the total thickness of the organic layers is thinned, the peak wavelength of blue may not be moved by maintaining 472 nm. Accordingly, it can be seen that the peak wavelength of blue is moved up to +4 nm.

Here, in "+", a peak wavelength may be moved to a long wavelength corresponding to a right side, and thus, color coordinates may be changed, whereby it is unable to express a desired color. Also, in "−", the peak wavelength may be moved to a short wavelength corresponding to a left side, and thus, the color coordinates may be changed, whereby it is unable to express a desired color. Therefore, it can be seen that the total thickness of the organic layers is a factor affecting an emittance peak in an EL spectrum, and thus, the EL spectrum is changed based on the total thickness of the organic layers. That is, it can be seen that the peak wavelength of (λmax) of the EL spectrum is moved approximately ±4 nm to ±8 nm, based on the total thickness of the organic layers.

Figure 7A:
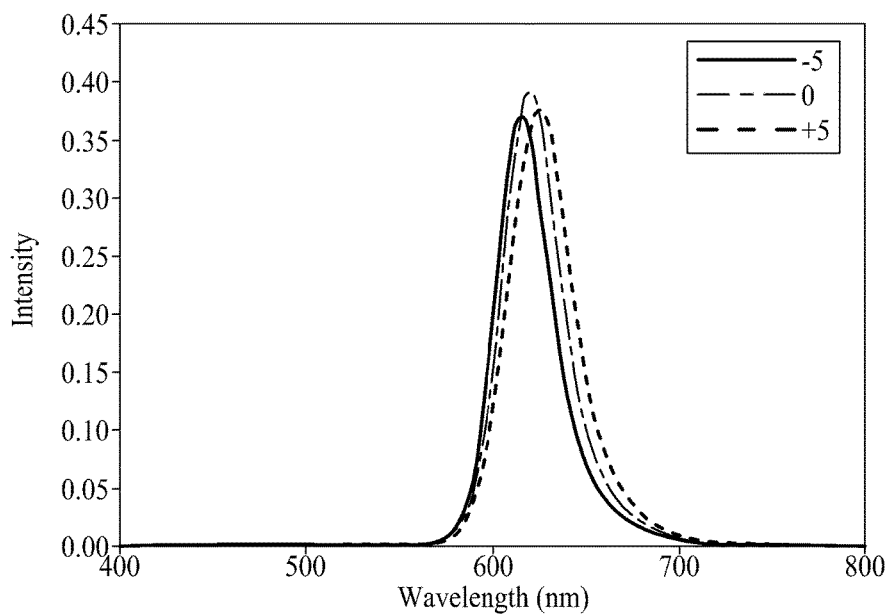
FIGS. 7A to 7C are diagrams showing EL spectrums based on a total thickness of organic layers in the first embodiment of the present invention.
Figure 7B:
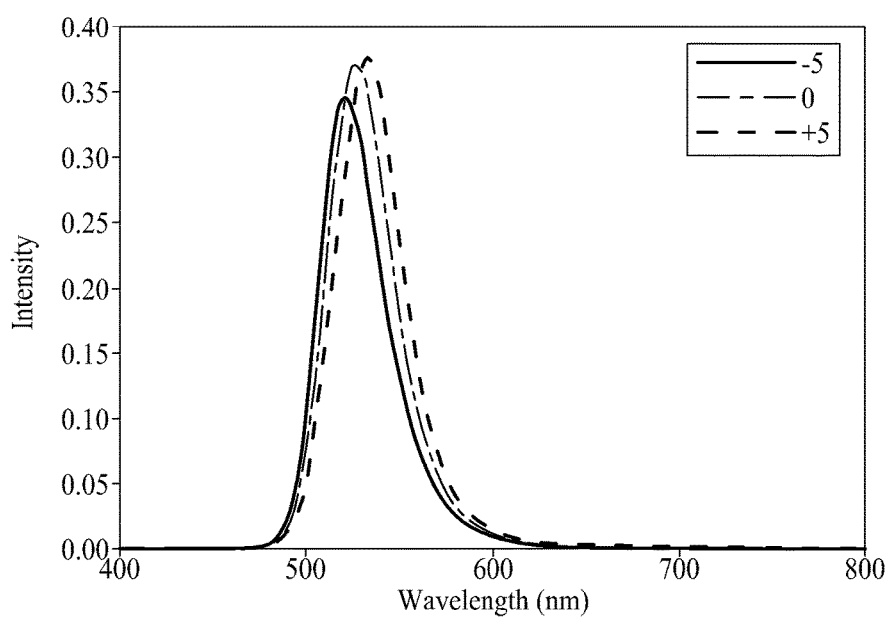
Figure 7C:
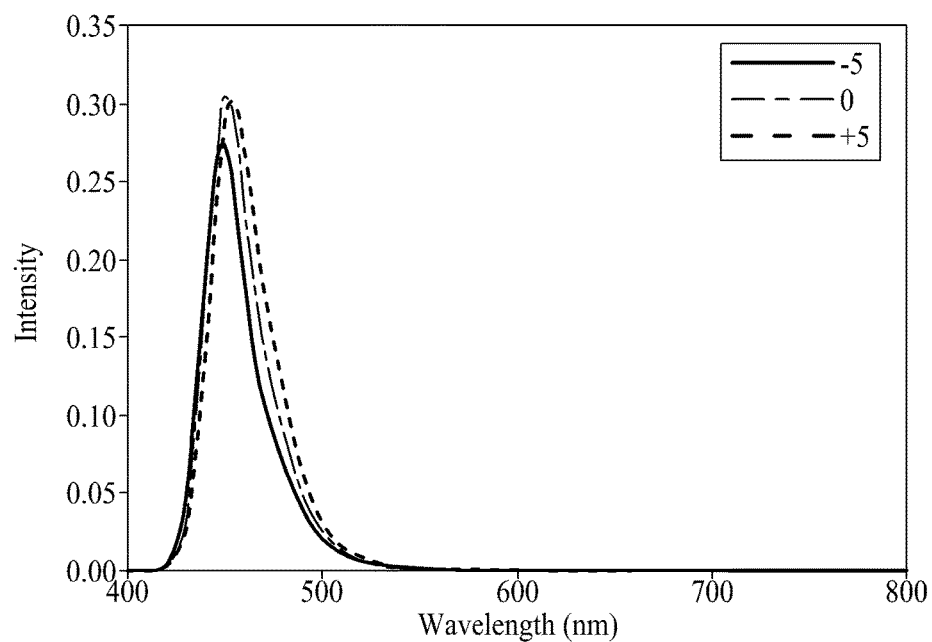

FIGS. 7A to 7C are diagrams showing EL spectrums based on a total thickness of organic layers in the first embodiment of the present invention.

In FIGS. 7A to 7C, the abscissa axis indicates a wavelength range (nm) of light, and the ordinate axis indicates emission intensity (a.u., arbitrary unit). The emission intensity may be a numerical value which is expressed as a relative value with respect to a maximum value of an EL spectrum.

FIG. 7A shows an EL spectrum of red. As shown in FIG. 7A, it can be seen that a difference between peak wavelengths (λmax) of EL spectrums of an organic light emitting display device occurs depending on a change in a total thickness of organic layers. That is, in a peak wavelength where 0 nm (where the total thickness of the organic layers is assumed as 290 nm) is a criterion, it can be seen that when the total thickness of the organic layers is thicker than 290 nm, a peak wavelength (λmax) of an EL spectrum of red is moved to a right side. Therefore, it can be seen that the peak wavelength (λmax) of the EL spectrum of red is moved by +4 nm. Also, in the peak wavelength where 0 nm (where the total thickness of the organic layers is assumed as 290 nm) is the criterion, it can be seen that when the total thickness of the organic layers is thinner than 290 nm which is the total thickness of the organic layers, the peak wavelength (λmax) of the EL spectrum of red is moved to a left side. Therefore, it can be seen that the peak wavelength (λmax) of the EL spectrum of red is moved by −8 nm. Accordingly, it can be seen that a difference between peak wavelengths (λmax) of the EL spectrum of red is −8 nm to +4 nm depending on a change in the total thickness of the organic layers.

FIG. 7B shows an EL spectrum of green. As shown in FIG. 7B, it can be seen that a difference between peak wavelengths (λmax) of EL spectrums of an organic light emitting display device occurs depending on a change in a total thickness of organic layers. That is, in a peak wavelength where 0 nm (where the total thickness of the organic layers is assumed as 230 nm) is a criterion, it can be seen that when the total thickness of the organic layers is thicker than 230 nm, a peak wavelength (λmax) of an EL spectrum of green is moved to a right side. Therefore, it can be seen that the peak wavelength (λmax) of the EL spectrum of green is moved by +8 nm. Also, in the peak wavelength where 0 nm (where the total thickness of the organic layers is assumed as 230 nm) is the criterion, it can be seen that when the total thickness of the organic layers is thinner than 230 nm which is the total thickness of the organic layers, the peak wavelength (λmax) of the EL spectrum of green is moved to a left side. Therefore, it can be seen that the peak wavelength (λmax) of the EL spectrum of green is moved by −4 nm. Accordingly, it can be seen that a difference between peak wavelengths (λmax) of the EL spectrum of green is −4 nm to +8 nm depending on a change in the total thickness of the organic layers.

FIG. 7C shows an EL spectrum of blue. As shown in FIG. 7C, it can be seen that a difference between peak wavelengths (λmax) of EL spectrums of an organic light emitting display device occurs depending on a change in a total thickness of organic layers. That is, in a peak wavelength where 0 nm (where the total thickness of the organic layers is assumed as 180 nm) is a criterion, it can be seen that when the total thickness of the organic layers is thicker than 180 nm, a peak wavelength (λmax) of an EL spectrum of blue is moved to a right side. Therefore, it can be seen that the peak wavelength (λmax) of the EL spectrum of blue is moved by +4 nm. Also, in the peak wavelength where 0 nm (where the total thickness of the organic layers is assumed as 180 nm) is the criterion, it can be seen that when the total thickness of the organic layers is thinner than 180 nm which is the total thickness of the organic layers, the peak wavelength (λmax) of the EL spectrum of blue is not moved. Therefore, it can be seen that a difference between peak wavelengths (λmax) of the EL spectrum of blue is +4 nm deepening on a change in on the total thickness of the organic layers. Accordingly, it can be seen that the peak wavelength of the EL spectrum is moved between ±4 nm to ±8 nm, based on the total thickness of the organic layers.

Moreover, among factors that affect a peak wavelength (λmax) of an EL spectrum of an organic light emitting display device, a content of dopants included in an EML will be described with reference to the following Table 2 and FIGS. 8A to 8C.

The following Table 2 shows a peak wavelength (λmax) of an EL spectrum of an organic light emitting display device based on a content of dopants included in an EML.

TABLE 2

| Content of dopants included in EML | R | G | B |
|---|---|---|---|
| 16% | — | 548 nm | — |
| 12% | — | 544 nm | — |
| 8% | — | 544 nm | 476 nm |
| 6% | 640 nm | — | — |
| 4% | 640 nm | — | 472 nm |
| 2% | 636 nm | — | 472 nm |

Table 2 shows results which are obtained by measuring peak wavelengths (λmax) of EL spectrums of red, green, and blue when the content of the dopants included in the EML is set to 2% to 16% in comparison with a host. A content of dopants included in each of red, green, and blue EMLs does not limit the details of the present invention.

As shown in Table 2, the content of the dopants included in the red EML may be set to 2%, 4%, and 6%. The peak wavelength (λmax) of the EL spectrum of red may have a range of 636 nm to 640 nm, based on the content of the dopants included in the red EML. In a case where 640 nm that is the peak wavelength (λmax) of the EL spectrum of red when the content of the dopants included in the red EML is 4% is a criterion, when the content of the dopants included in the red EML is 6%, a peak wavelength may not be moved by maintaining 640 nm. Also, in the case where 640 nm that is the peak wavelength (λmax) of the EL spectrum of red when the content of the dopants included in the red EML is 4% is the criterion, when the content of the dopants included in the red EML is 2%, a peak wavelength may be moved from 640 nm to 636 nm, and thus, a peak wavelength difference of −4 nm occurs. Accordingly, it can be seen that the peak wavelength of the EL spectrum of red is moved down to −4 nm, based on the content of the dopants included in the red EML.

Moreover, as shown in Table 2, the content of the dopants included in the green EML may be set to 8%, 12%, and 16%. The peak wavelength (λmax) of the EL spectrum of green may have a range of 544 nm to 548 nm, based on the content of the dopants included in the green EML. In a case where 544 nm that is the peak wavelength (λmax) of the EL spectrum of green when the content of the dopants included in the green EML is 12% is a criterion, when the content of the dopants included in the green EML is 16%, a peak wavelength may be moved from 544 nm to 548 nm, and thus, a peak wavelength difference of +4 nm occurs. Also, in the case where 544 nm that is the peak wavelength (λmax) of the EL spectrum of green when the content of the dopants included in the green EML is 12% is the criterion, when the content of the dopants included in the green EML is 8%, a peak wavelength may not be moved by maintaining 544 nm. Accordingly, it can be seen that the peak wavelength of the EL spectrum of green is moved up to +4 nm, based on the content of the dopants included in the green EML.

Moreover, as shown in Table 2, the content of the dopants included in the blue EML may be set to 2%, 4%, and 8%. The peak wavelength (λmax) of the EL spectrum of blue may have a range of 472 nm to 476 nm, based on the content of the dopants included in the blue EML. In a case where 472 nm that is the peak wavelength (λmax) of the EL spectrum of blue when the content of the dopants included in the blue EML is 4% is a criterion, when the content of the dopants included in the blue EML is 8%, a peak wavelength may be moved from 472 nm to 476 nm, and thus, a peak wavelength difference of +4 nm occurs. Also, in the case where 472 nm that is the peak wavelength (λmax) of the EL spectrum of blue when the content of the dopants included in the blue EML is 4% is the criterion, when the content of the dopants included in the blue EML is 2%, a peak wavelength may not be moved by maintaining 472 nm. Accordingly, it can be seen that the peak wavelength of the EL spectrum of blue is moved up to +4 nm, based on the content of the dopants included in the blue EML.

Figure 8A:
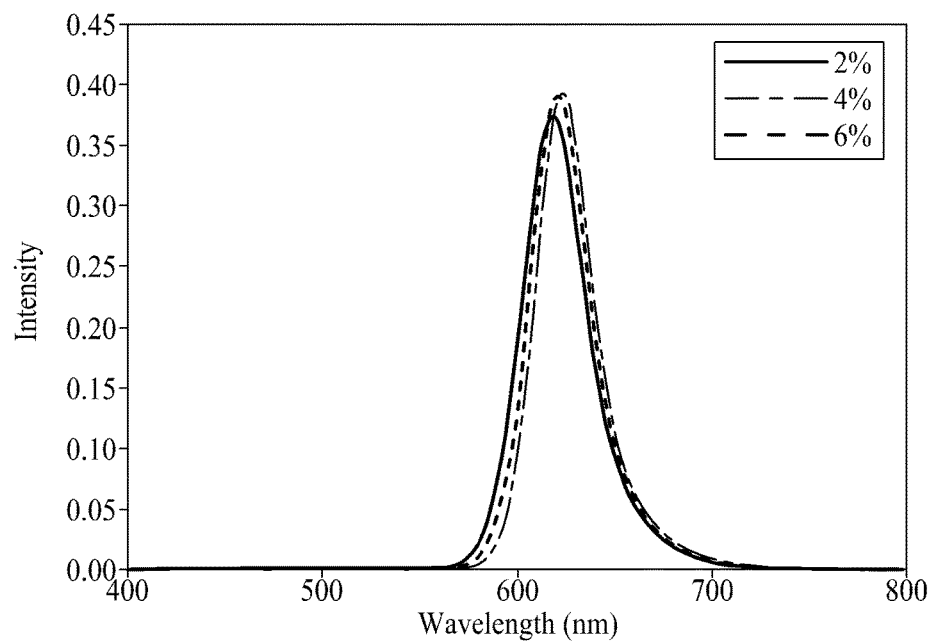
FIGS. 8A to 8C are diagrams showing EL spectrums based on a dopant content of an emission layer in the first embodiment of the present invention.
Figure 8B:
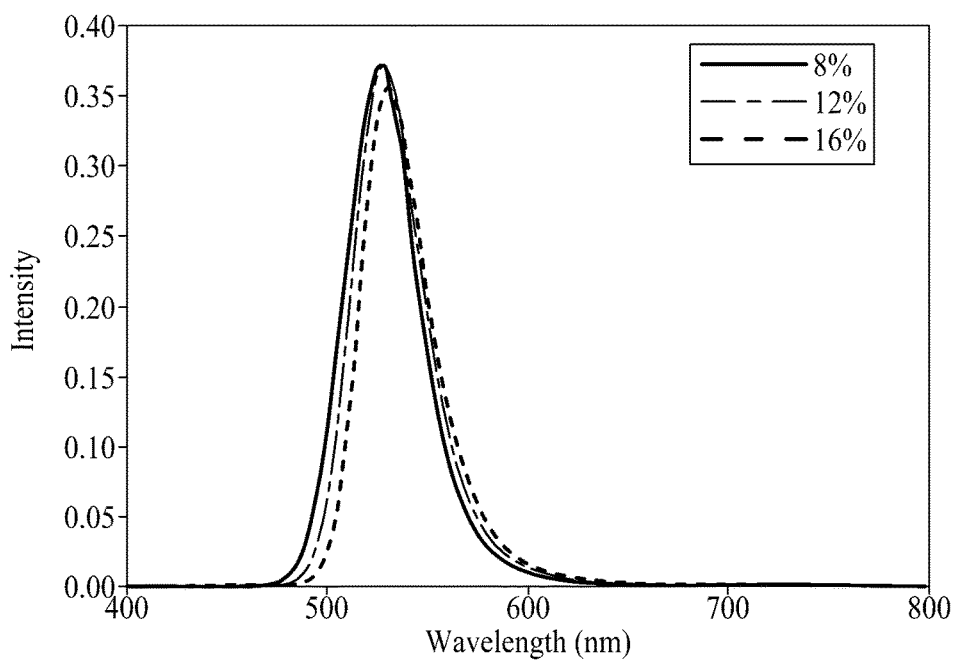
Figure 8C:
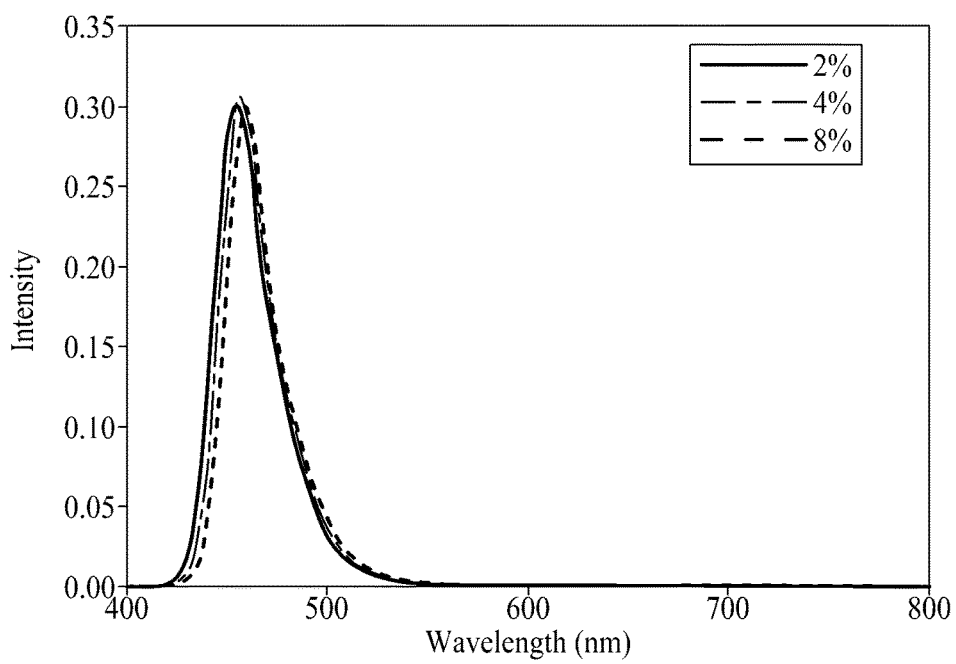

FIGS. 8A to 8C are diagrams showing EL spectrums based on a content of dopants included in an EML in the first embodiment of the present invention.

In FIGS. 8A to 8C, the abscissa axis indicates a wavelength range (nm) of light, and the ordinate axis indicates emission intensity (a.u., arbitrary unit). The emission intensity may be a numerical value which is expressed as a relative value with respect to a maximum value of an EL spectrum.

FIG. 8A shows an EL spectrum of red. As shown in FIG. 8A, it can be seen that a difference between peak wavelengths (λmax) of EL spectrums of an organic light emitting display device occurs depending on a content of dopants included in an EML. That is, in a peak wavelength where a content of dopants included in a red EML is 4% corresponding to a criterion, it can be seen that when a content of dopants increases, a peak wavelengths (λmax) of an EL spectrum of red is hardly moved. Also, in the peak wavelength where the content of the dopants included in the red EML is 4% corresponding to the criterion, it can be seen that when the content of the dopants is reduced, the peak wavelengths (λmax) of the EL spectrum of red is moved to a left side. Therefore, the peak wavelength (λmax) of the EL spectrum of red may be moved by +4 nm. Accordingly, it can be seen that the peak wavelength (λmax) of the EL spectrum of red is moved up to +4 nm, based on the content of the dopants included in the EML.

FIG. 8B shows an EL spectrum of green. As shown in FIG. 8B, it can be seen that a difference between peak wavelengths (λmax) of EL spectrums of an organic light emitting display device occurs depending on a content of dopants included in an EML. That is, in a peak wavelength where a content of dopants included in a green EML is 12% corresponding to a criterion, it can be seen that when a content of dopants increases, a peak wavelengths (λmax) of an EL spectrum of green is moved to a right side. Accordingly, the peak wavelengths (λmax) of the EL spectrum of green may be moved by +4 nm. Also, in the peak wavelength where the content of the dopants included in the green EML is 12% corresponding to the criterion, it can be seen that when the content of the dopants is reduced, the peak wavelengths (λmax) of the EL spectrum of green is hardly moved. Accordingly, it can be seen that the peak wavelength of the EL spectrum of green is moved up to +4 nm, based on the content of the dopants included in the EML.

FIG. 8C shows an EL spectrum of blue. As shown in FIG. 8C, it can be seen that a difference between peak wavelengths (λmax) of EL spectrums of an organic light emitting display device occurs depending on a content of dopants included in an EML. That is, in a peak wavelength where a content of dopants included in a blue EML is 4% corresponding to a criterion, it can be seen that when a content of dopants increases, a peak wavelengths (λmax) of an EL spectrum of blue is moved to a right side. Accordingly, the peak wavelengths (λmax) of the EL spectrum of blue may be moved by +4 nm. Also, in the peak wavelength where the content of the dopants included in the blue EML is 4% corresponding to the criterion, it can be seen that when the content of the dopants is reduced, the peak wavelengths (λmax) of the EL spectrum of blue is hardly moved. Accordingly, it can be seen that the peak wavelength of the EL spectrum of blue is moved up to +4 nm, based on the content of the dopants included in the EML.

As described above with reference to Tables 1 and 2 and FIGS. 7A to 7C and 8A to 8C, it can be seen that in the organic light emitting display device including the organic light emitting device of FIG. 1, the peak wavelength of the EL spectrum of the organic light emitting display device is moved based on the total thickness of the organic layers and the content of the dopants included in the EML. This may be substantially the same as the organic light emitting display device including the organic light emitting device of FIG. 2. Also, in the organic light emitting display device including the organic light emitting device of FIG. 2, the peak wavelength of the EL spectrum of the organic light emitting display device may be changed based on the total thickness of the organic layers, the content of the dopants included in the EML, and the content of the dopants included in the CGL. Therefore, the peak wavelength of the EL spectrum of the organic light emitting display device being moved based on the content of the dopants included in the CGL may be substantially the same as details which will be described below with reference to the following Table 5 and FIG. 11.

Moreover, a total thickness of organic layers, a content of dopants included in an EML, and a content of dopants included in a CGL, which affect a peak wavelength (λmax) of an EL spectrum of a bottom emission display device including the organic light emitting device of FIG. 4, will be described below with reference to the following Tables 3 to 5 and FIGS. 9 to 11. Also, the following Tables 3 to 5 and FIGS. 9 to 11 show results obtained through measurement performed for a bottom emission display device as an example. However, even in a top emission display device and a dual emission display device, a peak wavelength of an EL spectrum is affected by a total thickness of organic layers, a content of dopants included in a CGL, and a content of dopants included in an EML, and thus, the substantially same results may be obtained through measurement.

The following Table 3 shows a peak wavelength (λmax) of an EL spectrum of an organic light emitting display device based on a total thickness of organic layers.

TABLE 3

| Total thickness of organic layers | Wavelength | |
|---|---|---|
| +8 nm | 460 nm | 568 nm |
| +5 nm | 460 nm | 564 nm |
| +3 nm | 460 nm | 564 nm |
| 0 nm | 460 nm | 560 nm |
| −2 nm | 456 nm | 560 nm |
| −4 nm | 456 nm | 560 nm |

In Table 3, the total thickness of the organic layers denotes a thickness of organic layers disposed between a first electrode and a second electrode except a thickness of the first and second electrodes. Also, Table 3 shows results obtained through measurement performed for an organic light emitting display device including the white organic light emitting device of FIG. 4, and for example, the total thickness of the organic layers may be 450 nm, but does not limit details of the present invention. With 450 nm as a criterion, 450 nm may correspond to 0 nm, and +3 nm may correspond to 453 nm by forming an organic layer to a thickness which is 3 nm thicker than 450 nm. Here +5 nm may correspond to 455 nm by forming an organic layer to a thickness which is 5 nm thicker than 450 nm. Here +8 nm may correspond to 458 nm by forming an organic layer to a thickness which is 8 nm thicker than 450 nm. Also, −2 nm may correspond to 448 nm by forming an organic layer to a thickness which is 2 nm thinner than 450 nm. Further −4 nm may correspond to 446 nm by forming an organic layer to a thickness which is 4 nm thinner than 450 nm.

As shown in Table 3, a peak wavelength (λmax) of an EL spectrum of blue may have a range from 456 nm to 460 nm, based on the total thickness of the organic layers. In a case where 460 nm which is the peak wavelength (λmax) of the EL spectrum of blue when the total thickness of the organic layers is 0 nm is a criterion, when the total thickness of the organic layers is thickened, a peak wavelength of blue may not be moved by maintaining 460 nm. In the case where 460 nm which is the peak wavelength (λmax) of the EL spectrum of blue when the total thickness of the organic layers is 0 nm is the criterion, when the total thickness of the organic layers is thinned, the peak wavelength of blue may be moved from 460 nm to 456 nm, and thus, a peak wavelength difference of −4 nm occurs. Accordingly, it can be seen that the peak wavelength of blue is moved down to −4 nm.

Moreover, a peak wavelength (λmax) of an EL spectrum of yellow-green may have a range from 560 nm to 568 nm depending on a change in the total thickness of the organic layers. In a case where 560 nm which is the peak wavelength (λmax) of the EL spectrum of yellow-green when the total thickness of the organic layers is 0 nm is a criterion, when the total thickness of the organic layers is thickened, a peak wavelength of yellow-green may be moved from 560 nm to 564 nm, and thus, a peak wavelength difference of +4 nm occurs. Alternatively, in the case where 560 nm which is the peak wavelength (λmax) of the EL spectrum of yellow-green when the total thickness of the organic layers is 0 nm is the criterion, when the total thickness of the organic layers is thickened, a peak wavelength of yellow-green may be moved by from 560 nm to 568 nm, and thus, a peak wavelength difference of +8 nm occurs. In the case where 560 nm which is the peak wavelength (λmax) of the EL spectrum of yellow-green when the total thickness of the organic layers is 0 nm is the criterion, when the total thickness of the organic layers is thinned, the peak wavelength of yellow-green may not be moved by maintaining 560 nm. Accordingly, it can be seen that the peak wavelength of yellow-green is moved between +4 nm to +8 nm.

Here, in "+", a peak wavelength may be moved to a long wavelength corresponding to a right side, and thus, color coordinates may be changed, whereby it is unable to express a desired color. Also, in "−", the peak wavelength may be moved to a short wavelength corresponding to a left side, and thus, the color coordinates may be changed, whereby it is unable to express a desired color. Therefore, it can be seen that the total thickness of the organic layers is a factor affecting an emittance peak in an EL spectrum, and thus, the EL spectrum is changed based on the total thickness of the organic layers. That is, it can be seen that the peak wavelength of (λmax) of the EL spectrum is moved between ±4 nm to ±8 nm, based on the total thickness of the organic layers.

FIG. 9 is a diagram showing an EL spectrum based on a total thickness of organic layers.

In FIG. 9, the abscissa axis indicates a wavelength range (nm) of light, and the ordinate axis indicates emission intensity (a.u., arbitrary unit). The emission intensity may be a numerical value which is expressed as a relative value with respect to a maximum value of an EL spectrum. That is, 0.8 a.u. that is a value of an EL spectrum of blue may be set as a maximum value, and the emission intensity may be expressed by converting a value of an EL spectrum of yellow-green.

As shown in FIG. 9, it can be seen that a difference between peak wavelengths (λmax) of EL spectrums of an organic light emitting display device occurs depending on a change in a total thickness of organic layers. That is, in a peak wavelength where 0 nm (where the total thickness of the organic layers is assumed as 450 nm) is a criterion, it can be seen that when the total thickness of the organic layers is thicker than 450 nm, a peak wavelength (λmax) of an EL spectrum of blue is not moved. Also, in the peak wavelength where 0 nm (where the total thickness of the organic layers is assumed as 450 nm) is the criterion, it can be seen that when the total thickness of the organic layers is thinner than 450 nm which is the total thickness of the organic layers, the peak wavelength (λmax) of the EL spectrum of blue is moved to a left side. Therefore, it can be seen that the peak wavelength (λmax) of the EL spectrum of blue is moved by −4 nm. Accordingly, it can be seen that the peak wavelength of the EL spectrum of blue is moved down to −4 nm depending on a change in the total thickness of the organic layers.

Moreover, in a peak wavelength where 0 nm (where the total thickness of the organic layers is assumed as 450 nm) is a criterion, it can be seen that when the total thickness of the organic layers is thicker than 450 nm, a peak wavelength (λmax) of an EL spectrum of yellow-green is moved to a right side. Therefore, it can be seen that the peak wavelength (λmax) of the EL spectrum of green is moved by +4 nm to +8 nm. Also, in the peak wavelength where 0 nm (where the total thickness of the organic layers is assumed as 450 nm) is the criterion, it can be seen that when the total thickness of the organic layers is thinner than 450 nm which is the total thickness of the organic layers, the peak wavelength (λmax) of the EL spectrum of yellow-green is not moved. Accordingly, it can be seen that the peak wavelength of the EL spectrum of yellow-green is moved between +4 nm to +8 nm depending on a change in the total thickness of the organic layers.

Moreover, among factors that affect a peak wavelength (λmax) of an EL spectrum of an organic light emitting display device, a content of dopants included in an EML will be described with reference to the following Table 4 and FIG. 10.

The following Table 4 shows a peak wavelength (λmax) of an EL spectrum of an organic light emitting display device based on a content of dopants included in an EML.

TABLE 4

| Content of dopants included in EML | Wavelength |
| --- | --- |
| 20% | 568 nm |
| 16% | 564 nm |
| 12% | 564 nm |
| 8% | 556 nm |

In Table 4, an EML may be a yellow-green EML. Table 4 shows results which are obtained by measuring peak wavelengths (λmax) of EL spectrums of yellow-green when a content of dopants included in the EML is set to 8%, 12%, 16%, and 20%. The reason that a peak wavelength of an EL spectrum of the yellow-green EML is measured is because a content of dopants included in the yellow-green EML is higher than that of a blue EML, and thus, more affects PL than the blue EML.

As shown in Table 4, a peak wavelength (λmax) of an EL spectrum of yellow-green may have a range of 556 nm to 568 nm, based on the content of the dopants included in the EML. In a case where 564 nm that is the peak wavelength (λmax) of the EL spectrum of yellow-green when the content of the dopants included in the yellow-green EML is 16% is a criterion, when the content of the dopants included in the yellow-green EML is 20%, a peak wavelength may be moved from 564 nm to 568 nm, and thus, a peak wavelength difference of +4 nm occurs. Also, in the case where 564 nm that is the peak wavelength (λmax) of the EL spectrum of yellow-green when the content of the dopants included in the yellow-green EML is 16% is the criterion, when the content of the dopants included in the yellow-green EML is 12%, a peak wavelength may not be moved by maintaining 564 nm. Also, in the case where 564 nm that is the peak wavelength (λmax) of the EL spectrum of yellow-green when the content of the dopants included in the yellow-green EML is 16% is the criterion, when the content of the dopants included in the yellow-green EML is 8%, a peak wavelength may be moved from 564 nm to 556 nm, and thus, a peak wavelength difference of −8 nm occurs. Accordingly, it can be seen that the peak wavelength of the EL spectrum of yellow-green is moved between −8 nm to +4 nm, based on the content of the dopants included in the yellow-green EML. The content of the dopants included in the yellow-green EML does not limit the details of the present invention.

FIG. 10 is a diagram showing an EL spectrum of an organic light emitting display device based on a content of dopants included in an EML.

In FIG. 10, the abscissa axis indicates a wavelength range (nm) of light, and the ordinate axis indicates emission intensity (a.u., arbitrary unit). The emission intensity may be a numerical value which is expressed as a relative value with respect to a maximum value of an EL spectrum.

As shown in FIG. 10, it can be seen that a difference between peak wavelengths (λmax) of EL spectrums of an organic light emitting display device occurs depending on a content of dopants included in a yellow-green EML. That is, in a peak wavelength where the content of the dopants included in the yellow-green EML is 16% corresponding to a criterion, it can be seen that when a content of dopants increases, a peak wavelengths (λmax) of an EL spectrum of yellow-green is moved to a right side. Also, it can be seen that when the content of the dopants is reduced, the peak wavelengths (λmax) of the EL spectrum of yellow-green is moved to a left side. Accordingly, it can be seen that a difference between the peak wavelengths (λmax) of the EL spectrums of yellow-green is −8 nm to +4 nm.

Moreover, among factors that affect a peak wavelength (λmax) of an EL spectrum of an organic light emitting display device, a content of dopants included in a P-type CGL will be described with reference to the following Table 5 and FIG. 11.

The following Table 5 shows a peak wavelength (λmax) of an EL spectrum of an organic light emitting display device based on a content of dopants included in a P-type CGL.

TABLE 5

| Content of dopants included in first CGL | Content of dopants included in second CGL | Wavelength | |
|---|---|---|---|
| 10% | 10% | 456 nm | 560 nm |
| 10% | 8% | 456 nm | 556 nm |
| 8% | 8% | 460 nm | 560 nm |
| 8% | 5% | 460 nm | 560 nm |
| 5% | 5% | 456 nm | 556 nm |
| 3% | 3% | 460 nm | 564 nm |

In Table 5, a first CGL may be a CGL disposed between a first emission part and a second emission part, and a second CGL may be a CGL disposed between a second emission part and a third emission part. Also, each of the first CGL and the second CGL may be a P-type CGL. Table 5 shows results which are obtained by measuring peak wavelengths (λmax) of EL spectrums when a content of dopants included in the first CGL is set to 3%, 5%, 8%, and 10% and a content of dopants included in the second CGL is set to 3%, 5%, 8%, and 10%. A content of dopants included in the P-type CGL is higher than a content of dopants included in an N-type CGL, and thus, more affects an emittance peak. The content of the dopants included in the first CGL and the content of the dopants included in the second CGL do not limit the details of the present invention.

As shown in Table 5, a peak wavelength (λmax) of an EL spectrum of blue may have a range of 456 nm to 460 nm, based on the content of the dopants included in the P-type CGL. In a case where 460 nm that is a peak wavelength (λmax) of an EL spectrum when the content of the dopants included in the first P-type CGL is 8% and the content of the dopants included in the second P-type CGL is 8% is a criterion, when the content of the dopants included in the first P-type CGL is 10% and the content of the dopants included in the second P-type CGL is 8%, a peak wavelength may be moved from 460 nm to 456 nm, and thus, a peak wavelength difference of −4 nm occurs. Also, in the case where 460 nm that is a peak wavelength (λmax) of an EL spectrum when the content of the dopants included in the first P-type CGL is 8% and the content of the dopants included in the second P-type CGL is 8% is the criterion, when the content of the dopants included in the first P-type CGL is 10% and the content of the dopants included in the second P-type CGL is 10%, a peak wavelength may be moved from 460 nm to 456 nm, and thus, a peak wavelength difference of −4 nm occurs. Also, in the case where 460 nm that is a peak wavelength (λmax) of an EL spectrum when the content of the dopants included in the first P-type CGL is 8% and the content of the dopants included in the second P-type CGL is 8% is the criterion, when the content of the dopants included in the first P-type CGL is 8% and the content of the dopants included in the second P-type CGL is 5%, a peak wavelength may not be moved by maintaining 460 nm. Also, in the case where 460 nm that is a peak wavelength (λmax) of an EL spectrum when the content of the dopants included in the first P-type CGL is 8% and the content of the dopants included in the second P-type CGL is 8% is the criterion, when the content of the dopants included in the first P-type CGL is 5% and the content of the dopants included in the second P-type CGL is 5%, a peak wavelength may be moved from 460 nm to 456 nm, and thus, a peak wavelength difference of −4 nm occurs. Also, in the case where 460 nm that is a peak wavelength (λmax) of an EL spectrum when the content of the dopants included in the first P-type CGL is 8% and the content of the dopants included in the second P-type CGL is 8% is the criterion, when the content of the dopants included in the first P-type CGL is 3% and the content of the dopants included in the second P-type CGL is 3%, a peak wavelength may not be moved by maintaining 460 nm. Accordingly, it can be seen that the peak wavelength of the EL spectrum of blue is moved up down −4 nm, based on the content of the dopants included in the first P-type CGL and the content of the dopants included in the second P-type CGL.

Moreover, as shown in Table 5, a peak wavelength (λmax) of an EL spectrum of yellow-green may have a range of 556 nm to 564 nm, based on the content of the dopants included in the P-type CGL. In a case where 560 nm that is a peak wavelength (λmax) of an EL spectrum when the content of the dopants included in the first P-type CGL is 8% and the content of the dopants included in the second P-type CGL is 8% is a criterion, when the content of the dopants included in the first P-type CGL is 10% and the content of the dopants included in the second P-type CGL is 8%, a peak wavelength may be moved from 560 nm to 556 nm, and thus, a peak wavelength difference of −4 nm occurs. Also, in the case where 560 nm that is a peak wavelength (λmax) of an EL spectrum when the content of the dopants included in the first P-type CGL is 8% and the content of the dopants included in the second P-type CGL is 8% is the criterion, when the content of the dopants included in the first P-type CGL is 10% and the content of the dopants included in the second P-type CGL is 10%, a peak wavelength may not be moved by maintaining 560 nm. Also, in the case where 560 nm that is a peak wavelength (λmax) of an EL spectrum when the content of the dopants included in the first P-type CGL is 8% and the content of the dopants included in the second P-type CGL is 8% is the criterion, when the content of the dopants included in the first P-type CGL is 8% and the content of the dopants included in the second P-type CGL is 5%, a peak wavelength may be moved from 560 nm to 556 nm, and thus, a peak wavelength difference of −4 nm occurs. Also, in the case where 560 nm that is a peak wavelength (λmax) of an EL spectrum when the content of the dopants included in the first P-type CGL is 8% and the content of the dopants included in the second P-type CGL is 8% is the criterion, when the content of the dopants included in the first P-type CGL is 5% and the content of the dopants included in the second P-type CGL is 5%, a peak wavelength may be moved from 560 nm to 556 nm, and thus, a peak wavelength difference of −4 nm occurs. Also, in the case where 560 nm that is a peak wavelength (λmax) of an EL spectrum when the content of the dopants included in the first P-type CGL is 8% and the content of the dopants included in the second P-type CGL is 8% is the criterion, when the content of the dopants included in the first P-type CGL is 3% and the content of the dopants included in the second P-type CGL is 3%, a peak wavelength may be moved from 560 nm to 564 nm, and thus, a peak wavelength difference of +4 nm occurs. Accordingly, it can be seen that the peak wavelength of the EL spectrum of yellow-green is moved between −4 nm to +4 nm, based on the content of the dopants included in the first P-type CGL and the content of the dopants included in the second P-type CGL.

FIG. 11 is a diagram showing an EL spectrum of an organic light emitting display device based on a content of dopants included in a CGL.

In FIG. 11, the abscissa axis indicates a wavelength range (nm) of light, and the ordinate axis indicates emission intensity (a.u., arbitrary unit). The emission intensity may be a numerical value which is expressed as a relative value with respect to a maximum value of an EL spectrum. That is, 0.8 a.u. that is a value of an EL spectrum of blue may be set as a maximum value, and the emission intensity may be expressed by converting a value of an EL spectrum of yellow-green.

In FIG. 11, curve ① shows that a content of dopants included in a first P-type CGL of the first CGLs listed in Table 5 is 10% and a content of dopants included in a second P-type CGL of the second CGLs is 10%. A curve ② shows that the content of the dopants included in the first P-type CGL of the first CGLs listed in Table 5 is 10% and the content of the dopants included in the second P-type CGL of the second CGLs is 8%. A curve ③ shows that the content of the dopants included in the first P-type CGL of the first CGLs listed in Table 5 is 8% and the content of the dopants included in the second P-type CGL of the second CGLs is 8%. A curve ④ shows that the content of the dopants included in the first P-type CGL of the first CGLs listed in Table 5 is 8% and the content of the dopants included in the second P-type CGL of the second CGLs is 5%. A curve ⑤ shows that the content of the dopants included in the first P-type CGL of the first CGLs listed in Table 5 is 5% and the content of the dopants included in the second P-type CGL of the second CGLs is 5%. A curve ⑥ shows that the content of the dopants included in the first P-type CGL of the first CGLs listed in Table 5 is 3% and the content of the dopants included in the second P-type CGL of the second CGLs is 3%.

As shown in FIG. 11, it can be seen that a difference between peak wavelengths (λmax) of EL spectrums of an organic light emitting display device occurs depending on a content of dopants included in a CGL. In a case where curve ③ is a criterion, it can be seen that a peak wavelength (λmax) of an EL spectrum of the organic light emitting display device of a blue area is moved to a left side. Therefore, it can be seen that a peak wavelength difference of −4 nm occurs in the peak wavelength (λmax) of the EL spectrum of the organic light emitting display device of the blue area.

Moreover, in a case where curve ③ curve is a criterion, it can be seen that a peak wavelength (λmax) of an EL spectrum of the organic light emitting display device of a yellow-green area is moved to a left side and a right side. Therefore, it can be seen that a peak wavelength difference of ±4 nm occurs in the peak wavelength (λmax) of the EL spectrum of the organic light emitting display device of the yellow-green area.

As described above with reference to Tables 1 to 5 and FIGS. 7A to 11, it can be seen that in the organic light emitting display device including the organic light emitting device of FIG. 4, the peak wavelength of the EL spectrum of the organic light emitting display device is moved based on the total thickness of the organic layers, the content of the dopants included in the EML, and the content of the dopants included in the CGL. This may be substantially the same as the organic light emitting display device including the organic light emitting device of FIG. 3.

As described above with reference to Tables 1 to 5 and FIGS. 7A to 11, the inventors have reviewed a cause of a difference between peak wavelengths of EL spectrums which occurs in the organic light emitting display device depending on positions of a screen or angles at which the screen is seen. That is, in an organic light emitting display device including three pixels (for example, a red pixel, a green pixel, and a blue pixel), it can be seen that a peak wavelength of an EL spectrum of each of red, green, and blue is moved between ±4 nm to ±8 nm, based on a total thickness of organic layers and a content of dopants included in an EML. Also, in an organic light emitting display device including four pixels (for example, a white pixel, a red pixel, a green pixel, and a blue pixel) including a white organic light emitting device including three emission parts, it can be seen that a peak wavelength of an EL spectrum of each of blue and yellow-green is moved between ±4 nm to ±8 nm, based on a total thickness of organic layers, a content of dopants included in an EML, and a content of dopants included in a CGL.

As a result, it can be seen that a peak wavelength (λmax) of an EL spectrum of an organic light emitting display device is changed depending on a total thickness of organic layers, a content of dopants included in an EML, and a content of dopants included in a CGL. Therefore, it can be seen that a moving range of a peak wavelength (λmax) of an EL spectrum should be considered based on a total thickness of organic layers, a content of dopants included in an EML, and a content of dopants included in a CGL, for providing a screen having a uniform color with respect to a center or a side of the front of an organic light emitting display device. That is, a moving range of a peak wavelength (λmax) of an EL spectrum of an organic light emitting display device should be adjusted based on a total thickness of organic layers, a content of dopants included in an EML, and a content of dopants included in a CGL, for reducing a color difference that occurs in the organic light emitting display device depending on positions of a screen or angles at which the screen is seen. A result which is obtained by measuring an EL spectrum of an organic light emitting display device in which the above-described result is reflected will be described with reference to FIG. 12.

Figure 12:
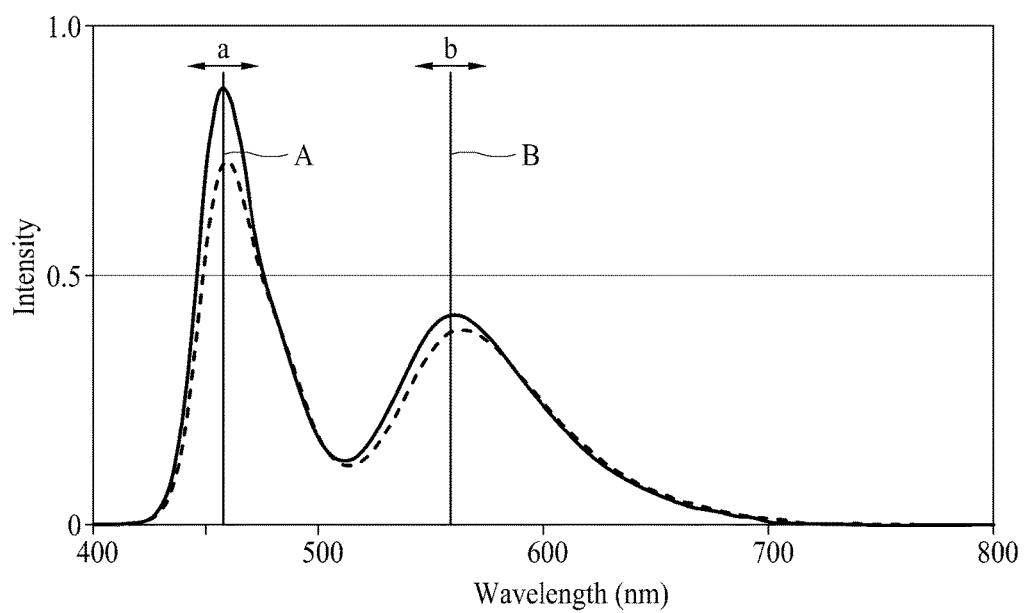
FIG. 12 is a diagram showing an EL spectrum according to an embodiment of the present invention.

FIG. 12 is a diagram showing an EL spectrum according to an embodiment of the present invention.

In FIG. 12, a solid line and a dotted line show EL spectrums measured from the front of an organic light emitting display device. The EL spectrum shown as the solid line and the EL spectrum shown as the dotted line have been measured based on different total thicknesses of organic layers, different contents of dopants included in an EML, and different contents of dopants included in a CGL, which affect the EL spectrums. Also, FIG. 12 shows an EL spectrum of an organic light emitting display device including the organic light emitting device of FIG. 4.

In FIG. 12, A indicates a criterion of a peak wavelength ($\lambda$max) of an EL spectrum of blue, and it can be seen that the peak wavelength ($\lambda$max) of the EL spectrum of blue is moved to a left side and a right side with respect to A. Therefore, a moving range (referred to by "a" in FIG. 12) of a peak wavelength ($\lambda$max) where a color difference does not occur should be adjusted based on a moving range of the peak wavelength ($\lambda$max) of the EL spectrum of blue. For example, when each of a first emission part and a third emission part includes a blue EML, a moving range of a peak wavelength ($\lambda$max) of an EL spectrum of an organic light emitting display device emitted from each of the first emission part and the third emission part should be adjusted to satisfy $\lambda$max±10 nm corresponding to a range from 10 nm less to 10 nm more than a predetermined peak wavelength ($\lambda$max). And the moving range of the peak wavelength ($\lambda$max) of the blue EL spectrum of the organic light emitting display device emitted from each of the first emission part and the third emission part should be adjusted to satisfy $\lambda$max±8 nm, corresponding to a range from 8 nm less to 8 nm more than the predetermined peak wavelength ($\lambda$max), or $\lambda$max±4 nm corresponding to a range from 4 nm less to 4 nm more than the predetermined peak wavelength ($\lambda$max). When each of the first emission part and the third emission part includes the blue EML, the moving range of the peak wavelength ($\lambda$max) of the EL spectrum of the organic light emitting display device emitted from each of the first emission part and the third emission part may be within a range of 450 nm to 480 nm. Alternatively, in an organic light emitting display device including two emission parts, a peak wavelength ($\lambda$max) of an EL spectrum of the organic light emitting display device emitted from a first emission part or a second emission part should be adjusted to $\lambda$max±10 nm corresponding to a range from 10 nm less to 10 nm more than the predetermined peak wavelength ($\lambda$max). And, the moving range of the peak wavelength ($\lambda$max) of the EL spectrum of the organic light emitting display device emitted from the first emission part and/or the second emission part should be adjusted to $\lambda$max±8 nm, corresponding to a range from 8 nm less to 8 nm more than the predetermined peak wavelength ($\lambda$max), or $\lambda$max±4 nm corresponding to a range from 4 nm less to 4 nm more than the predetermined peak wavelength ($\lambda$max). Therefore, a moving range of a peak wavelength ($\lambda$max) of an EL spectrum of an organic light emitting display device may be adjusted, thereby reducing a color difference that occurs because the peak wavelength ($\lambda$max) of the EL spectrum is changed depending on angles or positions at which the organic light emitting display device is seen. Also, the organic light emitting display device according to the embodiments of the present invention may have a PWES structure where a moving range of a peak wavelength ($\lambda$max) of an EL spectrum is set, thereby reducing a color difference which occurs in the front or side of the organic light emitting display device. In the PWES structure, a moving range of a peak wavelength ($\lambda$max) of an EL spectrum of an organic light emitting display device emitted from at least one emission part may be adjusted to $\lambda$max±10 nm corresponding to a range from 10 nm less to 10 nm more than the predetermined peak wavelength ($\lambda$max).

Moreover, an EML emitting blue light has been disclosed as an example for describing the embodiments of the present invention, and the organic light emitting device according to the embodiments of the present invention may include one of an EML emitting deep blue light and an EML emitting sky blue light. Also, even when the organic light emitting device according to the embodiments of the present invention includes the EML emitting the deep blue light and the EML emitting the sky blue light, a peak wavelength ($\lambda$max) of an EL spectrum of an organic light emitting display device emitted from an emission part including the EML should be adjusted to $\lambda$max±10 nm corresponding to a range from 10 nm less to 10 nm more than the predetermined peak wavelength ($\lambda$max). Also, in an organic light emitting display device including the organic light emitting device of FIGS. 1 to 3, since a color difference occurs depending on positions of a screen or angles at which the screen is seen, a peak wavelength ($\lambda$max) of an EL spectrum of the organic light emitting display device emitted from an emission part should be adjusted to $\lambda$max±10 nm corresponding to a range from 10 nm less to 10 nm more than the predetermined peak wavelength ($\lambda$max).

In FIG. 12, B indicates a criterion of a peak wavelength ($\lambda$max) of an EL spectrum of yellow-green, and it can be seen that the peak wavelength ($\lambda$max) of the EL spectrum of yellow-green is moved to a left side and a right side with respect to B. Therefore, a moving range (referred to by "b" in FIG. 12) of a peak wavelength ($\lambda$max) where a color difference does not occur should be adjusted based on a moving range of the peak wavelength ($\lambda$max) of the EL spectrum of yellow-green. For example, when the second emission part includes a yellow-green EML, a peak wavelength ($\lambda$max) of an EL spectrum of an organic light emitting display device emitted from the second emission part should be adjusted to satisfy $\lambda$max±10 nm corresponding to a range from 10 nm less to 10 nm more than a predetermined peak wavelength ($\lambda$max). The moving range of the peak wavelength ($\lambda$max) of the EL spectrum of the organic light emitting display device emitted from the first emission part or the second emission part should be adjusted to satisfy $\lambda$max±8 nm, corresponding to a range from 8 nm less to 8 nm more than the predetermined peak wavelength (X nm), or $\lambda$max±4 nm corresponding to a range from 4 nm less to 4 nm more than the predetermined peak wavelength ($\lambda$max). When the second emission part includes the yellow-green EML, the peak wavelength ($\lambda$max) of the EL spectrum of the organic light emitting display device emitted from the second emission part may be within a range of 550 nm to 570 nm. Therefore, a moving range of a peak wavelength ($\lambda$max) of an EL spectrum of an organic light emitting display device may be adjusted, thereby reducing a color difference that occurs because the peak wavelength ($\lambda$max) of the EL spectrum is changed depending on angles or positions at which the organic light emitting display device is seen. Also, the organic light emitting display device according to the embodiments of the present invention may have a PWES structure where a moving range of a peak wavelength ($\lambda$max) of an EL spectrum is set, thereby reducing a color difference which occurs in the front or side of the organic light emitting display device. In the PWES structure, a moving range of a peak wavelength ($\lambda$max) of an EL spectrum of an organic light emitting display device emitted from at least one emission part may be adjusted to $\lambda$max±10 nm corresponding to a range from 10 nm less to 10 nm more than the predetermined peak wavelength ($\lambda$max).

Moreover, an EML emitting yellow-green light has been disclosed as an example for describing the embodiments of the present invention, and the organic light emitting device according to the embodiments of the present invention may include an EML emitting green light or red light. Therefore, even when the organic light emitting device according to the embodiments of the present invention includes an EML emitting green light or an EML emitting red light instead of the yellow-green EML, a moving range of a peak wavelength (λmax) of an EL spectrum of an organic light emitting display device emitted from an emission part including the EML should be adjusted to λmax±10 nm corresponding to a range from 10 nm less to 10 nm more than the predetermined peak wavelength (λmax). Also, in an organic light emitting display device including the organic light emitting device of FIGS. 1 to 3, since a color difference occurs depending on positions of a screen or angles at which the screen is seen, a moving range of a peak wavelength (λmax) of an EL spectrum of the organic light emitting display device emitted from an emission part should be adjusted to λmax±10 nm corresponding to a range from 10 nm less to 10 nm more than the predetermined peak wavelength (λmax).

Therefore, according to the embodiments of the present invention, the peak wavelength (λmax) of the EL spectrum of the organic light emitting display device emitted from at least one emission part may be adjusted to λmax±10 nm corresponding to a range from 10 nm less to 10 nm more than the predetermined peak wavelength (λmax), thereby reducing a color difference caused by positions of the organic light emitting display device. Also, the organic light emitting device according to the embodiments of the present invention may be applied to a bottom emission display device, a top emission display device, and a dual emission display device.

As described above with reference to FIG. 12, it can be seen that the peak wavelength (λmax) of the EL spectrum of the organic light emitting display device should be adjusted to λmax±10 nm corresponding to a range from 10 nm less to 10 nm more than the predetermined peak wavelength (λmax). In order to satisfy the range, a total thickness of organic layers, a content of dopants included in an EML, and a content of dopants included in a P-type CGL should be adjusted.

A total thickness of organic layers will now be described for adjusting a peak wavelength (λmax) of an EL spectrum of an organic light emitting display device to λmax±10 nm corresponding to a range from 10 nm less to 10 nm more than the predetermined peak wavelength (λmax). As described above with reference to Table 1 and FIGS. 7A to 7C, a total thickness of organic layers may be changed depending on a structure or feature of an organic light emitting device, but a peak wavelength of an EL spectrum of red can be between −8 nm to +4 nm, by changing a total thickness of organic layers within a range from about −2% to about +2% (i.e., about ±2%) of a predetermined thickness, e.g. a thickness of 290 nm. Also, a peak wavelength of an EL spectrum of green can be moved between −4 nm to +8 nm, by changing a total thickness of organic layers within about −3% to about +3% (i.e., about ±3%) of the predetermined thickness, e.g. a thickness of 230 nm. Also, when a peak wavelength of an EL spectrum of blue can be moved up to +4 nm, by changing a total thickness of organic layers within a range from about −3% to about +3% (i.e., about ±3%) of the predetermined thickness, e.g. a thickness of 180 nm. As described above with reference to Table 3 and FIG. 9, a total thickness of organic layers may be changed depending on a structure or feature of an organic light emitting device. A peak wavelength of an EL spectrum of blue can be moved down to −4 nm and the peak wavelength can be moved by changing a total thickness of organic layers within a range from about −1% to about +2% of the predetermined thickness, e.g., a thickness of 450 nm. Also, a peak wavelength of an EL spectrum of yellow-green can be moved between +4 nm to +8 nm, by changing a total thickness of organic layers within a range from about −1% to about +2% of the predetermined thickness, e.g., a thickness of 450 nm. Here, the predetermined thickness may be a thickness that is adjusted based on emission positions of EMLs and optical characteristics of organic layers in a process of designing an organic light emitting display device. Therefore, since a peak wavelength (λmax) of an EL spectrum of an organic light emitting display device is changed depending on a structure or characteristic of an organic light emitting device, it can be seen through the measurement results shown in Tables 1 and 3 and FIGS. 7A to 7C and 9 that a total thickness of organic layers should have a range from 5% less to 5% more than the predetermined thickness in order for the peak wavelength of the EL spectrum of the organic light emitting display device to be adjusted to λmax±10 nm corresponding to a range from 10 nm less to 10 nm more than the predetermined peak wavelength (λmax). Also, it can be seen that a total thickness of organic layers should have a range from 3% less to 3% more than the predetermined thickness in order for the peak wavelength of the EL spectrum of the organic light emitting display device to be adjusted to λmax±8 nm corresponding to a range from 8 nm less to 8 nm more than the predetermined peak wavelength (λmax). Also, it can be seen that a total thickness of organic layers should have a range from 3% less to 3% more than the predetermined thickness in order for the peak wavelength of the EL spectrum of the organic light emitting display device to be adjusted to λmax±4 nm corresponding to a range from 4 nm less to 4 nm more than the predetermined peak wavelength (λmax). Also, it can be seen that a total thickness of organic layers should have a range from −5% to +5% (i.e., ±5%) of the predetermined thickness in order for the peak wavelength of the EL spectrum of the organic light emitting display device to be adjusted to λmax±10 nm corresponding to a range from 10 nm less to 10 nm more than the predetermined peak wavelength (λmax).

Moreover, a content of dopants included in an EML will now be described for adjusting a peak wavelength (λmax) of an EL spectrum of an organic light emitting display device to λmax±10 nm corresponding to a range from 10 nm less to 10 nm more than the predetermined peak wavelength (λmax). As described above with reference to Table 2 and FIGS. 8A to 8C, a content of dopants included in an EML may be changed depending on a structure or feature of an organic light emitting device. A peak wavelength of red can be moved down to −4 nm by changing a content of dopants included in a red EML within a range from −50% to +50% (i.e., ±50%) of a predetermined content of dopants, e.g., a content of 4%. Also, a peak wavelength of an EL spectrum of green can be moved up to +4 nm by changing a content of dopants included in a green EML is within a range from −30% to +30% (i.e., ±30%) of the predetermined content of dopants, e.g., a content of 12%. Also, a peak wavelength of an EL spectrum of blue can be moved up to +4 nm by changing a content of dopants included in a blue EML is within a range from −50% to +50% (i.e., ±50%) of the predetermined content of dopants, e.g., a content of 4%. As described above with reference to Table 4 and FIG. 10, a content of dopants included in an EML may be changed depending on a structure or feature of an organic light emitting device. A peak wavelength of yellow-green can be moved between −8 nm to +4 nm by changing a content of dopants included in a yellow-green EML is within a range of −50% to +30% of the predetermined content of dopants, e.g., content of 16%. Here, the predetermined content of dopants may be a content of dopants that is adjusted based on an emission efficiency of an EML based on the content of dopants in a process of designing an organic light emitting display device. Therefore, a peak wavelength (λmax) of an EL spectrum of an organic light emitting display device is changed depending on a structure or characteristic of an organic light emitting device, it can be seen through the measurement results shown in Tables 2 and 4 and FIGS. 8A to 8C and 10 that a content of dopants included in an EML should be within a range from 0% less to 50% more than the predetermined content of dopants in order for the peak wavelength of the EL spectrum of the organic light emitting display device to be adjusted to λmax±10 nm corresponding to a range from 10 nm less to 10 nm more than the predetermined peak wavelength (λmax). Also, a content of dopants included in an EML should have a range from 50% less to 50% more than the predetermined content of dopants in order for the peak wavelength of the EL spectrum of the organic light emitting display device to be adjusted to λmax±8 nm corresponding to a range from 8 nm less to 8 nm more than the predetermined peak wavelength (λmax). Also, a content of dopants included in an EML should have a range from 30% less to 30% more than the predetermined content of dopants in order for the peak wavelength of the EL spectrum of the organic light emitting display device to be adjusted to λmax±4 nm corresponding to a range from 4 nm less to 4 nm more than the predetermined peak wavelength (λmax). Also, a content of dopants included in an EML should have a range from −50% to +50% (i.e., ±50%) of the predetermined content of dopants in order for the peak wavelength of the EL spectrum of the organic light emitting display device to be adjusted to λmax±10 nm corresponding to a range from 10 nm less to 10 nm more than the predetermined peak wavelength (λmax).

Moreover, a content of dopants included in a P-type CGL will now be described for adjusting a peak wavelength (λmax) of an EL spectrum of an organic light emitting display device to λmax±10 nm corresponding to a range from 10 nm less to 10 nm more than the predetermined peak wavelength (λmax). As described above with reference to Table 5 and FIG. 11, a content of dopants included in a P-type CGL may be changed depending on a structure or feature of an organic light emitting device. A peak wavelength of blue can be moved down to −4 nm by changing a content of dopants included in a P-type CGL is within a range from about −70% to about +25% of the predetermined content of dopants, e.g., a content of 16%. Also, a peak wavelength of yellow-green can be moved between −4 nm to +4 nm by changing a content of dopants included in a P-type CGL is within a range from about −70% to about +25% of the predetermined content of dopants, e.g., a content of 16%. Here, the predetermined content of dopants may be a content of dopants that is adjusted based on an emission efficiency of an EML based on the content of dopants in a process of designing an organic light emitting display device. Therefore, a peak wavelength (λmax) of an EL spectrum of an organic light emitting display device is changed depending on a structure or characteristic of an organic light emitting device, it can be seen through the measurement results shown in Table 5 and FIG. 11 that a content of dopants included in a P-type CGL should have a range from 50% less to 50% more than the predetermined content of dopants in order for the peak wavelength of the EL spectrum of the organic light emitting display device to be adjusted to λmax±10 nm corresponding to a range from 10 nm less to 10 nm more than the predetermined peak wavelength (λmax). Also, it can be seen that a content of dopants included in a P-type CGL should have a range from 50% less to 50% more than the predetermined content of dopants in order for the peak wavelength of the EL spectrum of the organic light emitting display device to be adjusted to λmax±8 nm corresponding to a range from 8 nm less to 8 nm more than the predetermined peak wavelength (λmax). Also, it can be seen that a content of dopants included in a P-type CGL should have a range from 30% less to 30% more than the predetermined content of dopants in order for the peak wavelength of the EL spectrum of the organic light emitting display device to be adjusted to λmax±4 nm corresponding to a range from 4 nm less to 4 nm more than the predetermined peak wavelength (λmax). Also, it can be seen that a content of dopants included in a P-type CGL should have a range from −50% to +50% (i.e., ±50%) of the predetermined content of dopants in order for the peak wavelength of the EL spectrum of the organic light emitting display device to be adjusted to λmax±10 nm corresponding to a range from 10 nm less to 10 nm more than the predetermined peak wavelength (λmax).

Moreover, Table 5 and FIG. 11 relate to an organic light emitting device including two P-type CGLs, and it can be seen that a content of dopants included in each of the two P-type CGLs should have a range from 50% less to 50% more than the predetermined content of dopants. Alternatively, when the organic light emitting device of FIG. 3 includes one P-type CGL, it can be seen that a content of dopants included in the P-type CGL should have a range from 50% less to 50% more than the predetermined content of dopants.

Therefore, it can be seen that a range of a total thickness of organic layers, a range of a content of dopants included in an EML, and/or a range of a content of dopants included in a P-type CGL should be adjusted in order for a peak wavelength of an EL spectrum of an organic light emitting display device to be adjusted to λmax±10 nm corresponding to a range from 10 nm less to 10 nm more than the predetermined peak wavelength (λmax). A peak wavelength of an EL spectrum of an organic light emitting display device may be obtained based on interaction between a total thickness of organic layers, a content of dopants included in an EML, and a content of dopants included in a P-type CGL, and thus, even when a range of at least one factor of a total thickness of organic layers, a content of dopants included in an EML, and a content of dopants included in a P-type CGL is outside a predetermined range, by controlling a range of another factor different from the at least one factor, the peak wavelength of the EL spectrum of the organic light emitting display device may be adjusted to λmax±10 nm corresponding to a range from 10 nm less to 10 nm more than the predetermined peak wavelength (λmax). Also, a range of a total thickness of organic layers, a range of a content of dopants included in an EML, and/or a range of a content of dopants included in a P-type CGL may be adjusted by a combination thereof, and thus, the peak wavelength of the EL spectrum of the organic light emitting display device may be adjusted to λmax±10 nm corresponding to a range from 10 nm less to 10 nm more than the predetermined peak wavelength (λmax). That is, the peak wavelength of the EL spectrum of the organic light emitting display device may be adjusted to λmax±10 nm corresponding to a range from 10 nm less to 10 nm more than the predetermined peak wavelength (λmax), based on conditions where a total thickness of organic layers is within a range from 5% less to 5% more or a range from 3% less to 3% more than the predetermined total thickness, a content of dopants included in an EML is within a range from 50% less to 50% more or a range from 30% less to 30% more than the predetermined content of dopants, and a content of dopants included in a P-type CGL is within a range from 50% less to 50% more or a range from 30% less to 30% more than the predetermined content of dopants, and a combination thereof. Alternatively, the peak wavelength of the EL spectrum of the organic light emitting display device may be adjusted to λmax±8 nm corresponding to a range from 8 nm less to 8 nm more than the predetermined peak wavelength (λmax), based on conditions where a total thickness of organic layers is within a range from 5% less to 5% more or a range from 3% less to 3% more than the predetermined total thickness, a content of dopants included in an EML is within a range from 50% less to 50% more or a range from 30% less to 30% more than the predetermined content of dopants, and a content of dopants included in a P-type CGL is within a range from 50% less to 50% more or a range from 30% less to 30% more than the predetermined content of dopants, and a combination thereof. Alternatively, the peak wavelength of the EL spectrum of the organic light emitting display device may be adjusted to λmax±4 nm corresponding to a range from 4 nm less to 4 nm more than the predetermined peak wavelength (λmax), based on conditions where a total thickness of organic layers is within a range from 5% less to 5% more or a range from 3% less to 3% more than the predetermined total thickness, a content of dopants included in an EML is within a range from 50% less to 50% more or a range from 30% less to 30% more than the predetermined content of dopants, and a content of dopants included in a P-type CGL is within a range from 50% less to 50% more or a range from 30% less to 30% more than the predetermined content of dopants, and a combination thereof.

As described above, according to the embodiments of the present invention, the moving range of the peak wavelength of the EL spectrum of the organic light emitting display device is optimized, thereby reducing a color defect or a color difference which occurs in the front or side of the organic light emitting display device.

Moreover, according to the embodiments of the present invention, since the organic light emitting display device has the PWES structure where the moving range of the peak wavelength of the EL spectrum of the organic light emitting display device is set, thereby reducing the color defect or the color difference which occurs in the front or side of the organic light emitting display device.

The details of the embodiments of the present invention described in technical problems, technical solutions, and advantageous effects may not specify essential features of claims, and thus, the scope of claims is not limited by the details described in detailed description of the embodiments of the invention.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
   a first electrode and a second electrode; and
   an organic layer between the first electrode and the second electrode, the organic layer including at least one emission part, and the at least one emission part comprising at least one emission layer,
   wherein the organic layer is configured so that a peak wavelength of an electroluminescence (EL) spectrum of the organic light emitting display device emitted from the at least one emission part is within a range from 10 nm less than a predetermined peak wavelength to 10 nm more than the predetermined peak wavelength by adjusting at least one of a total thickness of the organic layer and a content of a dopant included in the at least one emission layer.

2. The organic light emitting display device of claim 1, wherein the at least one emission layer includes one of a red emission layer, a green emission layer, and a blue emission layer.

3. The organic light emitting display device of claim 2, wherein a peak wavelength of an EL spectrum of red is within a range of 600 nm to 650 nm.

4. The organic light emitting display device of claim 2, wherein a peak wavelength of an EL spectrum of green is within a range of 520 nm to 550 nm.

5. The organic light emitting display device of claim 2, wherein a peak wavelength of an EL spectrum of blue is within a range of 450 nm to 480 nm.

6. The organic light emitting display device of claim 1, wherein the total thickness of the organic layer is within a range from 5% less than a predetermined thickness to 5% more than the predetermined thickness.

7. The organic light emitting display device of claim 1, wherein:
   the content of the dopant is within a range from 50% less than a predetermined content of the dopant to 50% more than the predetermined content of the dopant.

8. The organic light emitting display device of claim 1, wherein λmax is the predetermined peak wavelength, and
   wherein the organic layer is configured so that a peak wavelength of an EL spectrum of the organic light emitting display device emitted from the at least one emission part satisfies λmax±8 nm corresponding to a range from 8 nm less than the predetermined peak wavelength to 8 nm more than the predetermined peak wavelength.

9. The organic light emitting display device of claim 8, wherein the total thickness of the organic layer is within a range from 3% less than a predetermined thickness to 3% more than the predetermined thickness.

10. The organic light emitting display device of claim 8, wherein:
    the content of the dopant is within a range from 50% less than a predetermined content of the dopant to 50% more than the predetermined content of the dopant.

11. The organic light emitting display device of claim 8, wherein:
    the at least one emission part comprises:
    a first emission part and a second emission part; and
    a P-type charge generation layer between the first emission part and the second emission part, the P-type charge generation layer including at least one host and a dopant, and
    a content of the dopant in the P-type charge generation layer is within a range from 50% less than a predetermined content of the dopant in the P-type charge generation layer to 50% more than the predetermined content of the dopant in the P-type charge generation layer.

12. The organic light emitting display device of claim 1, wherein λmax is the predetermined peak wavelength, and
    wherein the organic layer is configured so that a peak wavelength of an EL spectrum of the organic light emitting display device emitted from the at least one emission part satisfies λmax±4 nm corresponding to a range from 4 nm less than the predetermined peak wavelength to 4 nm more than the predetermined peak wavelength.

13. The organic light emitting display device of claim 12, wherein the total thickness of the organic layer is within a range from 3% less than a predetermined thickness to 3% more than the predetermined thickness.

14. The organic light emitting display device of claim 12, wherein:
the content of the dopant is within a range from 30% less than a predetermined content of the dopant to 30% more than the predetermined content of the dopant.

15. The organic light emitting display device of claim 12, wherein:
the at least one emission part comprises:
a first emission part and a second emission part; and
a P-type charge generation layer between the first emission part and the second emission part, the P-type charge generation layer including at least one host and a dopant, and
a content of the dopant in the P-type charge generation layer is within a range from 30% less than a predetermined content of the dopant in the P-type charge generation layer to 30% more than the predetermined content of the dopant in the P-type charge generation layer.

16. An organic light emitting display device comprising:
a first electrode and a second electrode; and
an organic layer between the first electrode and the second electrode, the organic layer including at least one emission part,
wherein the organic layer is configured so that a peak wavelength of an electroluminescence (EL) spectrum of the organic light emitting display device emitted from the at least one emission part is within a range from 10 nm less than a predetermined peak wavelength to 10 nm more than the predetermined peak wavelength, and
wherein:
the at least one emission part includes two emission parts,
the two emission parts comprise a plurality of emission layers having a same wavelength range, and
each of the plurality of emission layers having the same wavelength range is one of a red emission layer, a green emission layer, and a blue emission layer.

17. The organic light emitting display device of claim 16, further comprising a P-type charge generation layer between the two emission parts, the P-type charge generation layer including at least one host and a dopant,
wherein a content of the dopant is within a range from 30% less than a predetermined content of the dopant to 30% more than the predetermined content of the dopant.

18. The organic light emitting display device of claim 16, wherein the total thickness of the organic layer is within a range from 3% less than a predetermined thickness to 3% more than the predetermined thickness.

19. The organic light emitting display device of claim 16, wherein:
the plurality of emission layers comprise at least one host and a dopant, and
a content of the dopant is within a range from −50% to +50% of a predetermined content of the dopant.

20. The organic light emitting display device of claim 16, wherein:
the at least one emission part further includes a third emission part including an emission layer, and
the at least one among a plurality of emission layers of the two emission parts and the third emission layer comprise at least one host and a dopant, and
a content of the dopant is within a range from −50% to +50% of a predetermined content of the dopant.

21. An organic light emitting display device comprising:
a first electrode and a second electrode; and
an organic layer between the first electrode and the second electrode, the organic layer including at least one emission part,
wherein the organic layer is configured so that a peak wavelength of an electroluminescence (EL) spectrum of the organic light emitting display device emitted from the at least one emission part is within a range from 10 nm less than a predetermined peak wavelength to 10 nm more than the predetermined peak wavelength, and
wherein:
the at least one emission part includes two emission parts,
the two emission parts comprise a first emission part including a first emission layer and a second emission part including a second emission layer,
the first emission layer comprises one of a blue emission layer, a deep blue emission layer, and a sky blue emission layer, and
the second emission layer comprises one of a yellow-green emission layer, a green emission layer, a red emission layer and a yellow-green emission layer, and a red emission layer and a green emission layer.

22. The organic light emitting display device of claim 21, wherein a peak wavelength of an EL spectrum emitted from the first emission part is within a range of 450 nm to 480 nm.

23. The organic light emitting display device of claim 21, wherein a peak wavelength of an EL spectrum emitted from the second emission part is within a range of 520 nm to 650 nm.

24. The organic light emitting display device of claim 21, further comprising a P-type charge generation layer between the first emission part and the second emission part, the P-type charge generation layer including at least one host and a dopant,
wherein a content of the dopant is within a range from 30% less than a predetermined content of the dopant to 30% more than the predetermined content of the dopant.

25. The organic light emitting display device of claim 21, wherein:
the at least one emission part further includes a third emission part including a third emission layer to have three emission parts, and
the third emission layer comprises one of a blue emission layer, a deep blue emission layer, and a sky blue emission layer.

26. The organic light emitting display device of claim 25, wherein a peak wavelength of an EL spectrum emitted from each of the first emission part and the third emission part is within a range of 450 nm to 480 nm.

27. The organic light emitting display device of claim 25, wherein a peak wavelength of an EL spectrum emitted from the second emission part is within a range of 520 nm to 650 nm.

28. The organic light emitting display device of claim 25, further comprising:

a first P-type charge generation layer between the first emission part and the second emission part; and a second P-type charge generation layer between the second emission part and the third emission part, wherein:

each of the first and second P-type charge generation layers comprises at least one host and a dopant, and a content of the dopant included in each of the first and second P-type charge generation layers is within a range from 50% less than a predetermined content of the dopant to 50% more than the predetermined content of the dopant.

29. The organic light emitting display device of claim 25, wherein a total thickness of the organic layer is within a range from 3% less than a predetermined thickness to 3% more than the predetermined thickness.

30. The organic light emitting display device of claim 25, wherein the at least one among the first emission layer, the second emission layer, and the third emission layer comprise at least one host and a dopant, and a content of the dopant is within a range from −50% to +50% of a predetermined content of the dopant.

* * * * *